United States Patent
Denda et al.

(10) Patent No.: US 7,714,629 B2
(45) Date of Patent: May 11, 2010

(54) DELAY CIRCUIT AND DELAY TIME ADJUSTMENT METHOD

(75) Inventors: Tatsuaki Denda, Nagano (JP);
Kazuhiro Kobayashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/128,185

(22) Filed: May 28, 2008

(65) Prior Publication Data
US 2008/0297221 A1 Dec. 4, 2008

(30) Foreign Application Priority Data
May 29, 2007 (JP) ............................. 2007-142563
Dec. 27, 2007 (JP) ............................. 2007-337605

(51) Int. Cl.
*H03H 11/26* (2006.01)
(52) U.S. Cl. ...................................... 327/276; 327/277
(58) Field of Classification Search ......... 327/262–264, 327/276–278, 284–285, 564–565
See application file for complete search history.

(56) References Cited

U.S. PATENT DOCUMENTS

| 6,424,198 | B1* | 7/2002 | Wolford | 327/291 |
| 6,574,154 | B2* | 6/2003 | Sato et al. | 365/198 |
| 7,382,170 | B2* | 6/2008 | Pollock | 327/261 |

FOREIGN PATENT DOCUMENTS

| JP | 5-063315 | 3/1993 |
| JP | 5-175415 | 7/1993 |
| JP | 8-125073 | 5/1996 |
| JP | 11-135920 | 5/1999 |
| JP | 2001-251030 | 9/2001 |
| JP | 2004-356251 | 12/2004 |

* cited by examiner

*Primary Examiner*—An T Luu
(74) *Attorney, Agent, or Firm*—Rankin, Hill & Clark LLP

(57) ABSTRACT

A delay circuit includes an interface for giving a command of setting a delay time and a delay device that can be set to any desired delay time, and the delay time of the delay device is set according to a command from the interface.

17 Claims, 18 Drawing Sheets

DELAY CIRCUIT AND DELAY TIME ADJUSTMENT METHOD

This application claims priorities to Japanese Patent Application No. 2007-142563, filed May 29, 2007 and Japanese Patent Application No. 2007-337605, filed Dec. 27, 2007, in the Japanese Patent Office. The Japanese Patent Application No. 2007-142563 and Japanese Patent Application No. 2007-337605 are incorporated by reference in its entirety.

TECHNICAL FIELD

The present disclosure relates to a delay circuit and a delay time adjustment method for adjusting the delay time of signal propagation of wiring of a wiring board of a mount board, a semiconductor package, etc.

RELATED ART

"Skew" occurs in wiring of a wiring board used with a mount board, a semiconductor package, etc. The "skew" means that although the transmitting party transmits a signal at the same time, the signal arrives at the receiving parties at different timings due to differences in the type of load between wires, pattern length, etc. Various means for adjusting the delay time of signal propagation to eliminate such skew have been developed. For example, a method of adjusting other wiring patterns by inserting a meander pattern to match with the wiring length of the longest wiring pattern is available.

For example, in a semiconductor integrated circuit package housing a semiconductor integrated circuit, available is a method of providing a delay element housing section for detachably housing a delay element having an electric delay time between an input/output pin of a semiconductor integrated circuit and a pin of a semiconductor integrated circuit package connected to the input/output pin and installing a delay element having a necessary delay time in the delay element housing section, thereby adjusting the delay time. (For example, refer to patent document 1.)

For example, a semiconductor integrated circuit package of a structure wherein an insulating material is filed onto an input/output buffer of a semiconductor integrated circuit chip and a radiation lead line is placed thereon is proposed. (For example, refer to patent document 2.) According to this, the heat release from the radiation lead line is adjusted, whereby the delay time is adjusted.

For example, a method of giving adequate capacitive load to a wiring pattern and obtaining a necessary delay time is proposed. (For example, refer to patent documents 3 and 4.)

For example, a method of adjusting the delay time by changing the dielectric constant of an insulator surrounding a wiring pattern is proposed. (For example, refer to patent document 5.)

For example, a delay time adjustment method using a fixed resistor is proposed. (For example, refer to patent document 6.)

[Patent document 1] Japanese Patent Application Publication No. 5-175415

[Patent document 2] Japanese Patent Application Publication No. 8-125073

[Patent document 3] Japanese Patent Application Publication No. 5-63315

[Patent document 4] Japanese Patent No. 3415830

[Patent document 5] Japanese Patent Application Publication No. 2004-356251

[Patent document 6] Japanese Patent Application Publication No. 11-135920

The method of inserting a meander pattern to adjust the delay time is disadvantageous for a semiconductor integrated circuit of high density mounting because the meander pattern requires a large space on the board.

According to the art described in patent document 1 (JP-A-5-175415), it is necessary to make preparations for a delay element for each delay time. If a delay element is placed in the delay element housing section and is contained in the semiconductor integrated circuit package, later change in the delay time cannot be made. It is also difficult to miniaturize the semiconductor integrated circuit package because of the structure wherein a delay element is placed in the delay element housing section. Further, there are two electric contacts to place a delay element in the delay element housing section and there is also a possibility that the electric contacts may cause a contract failure to occur.

According to the art described in patent document 2 (JP-A-8-125073), to keep the setup delay time constant, the heat release from the radiation lead line needs to be made constant and thus a mechanism for keeping the temperature on the periphery of the semiconductor integrated circuit package constant becomes necessary and therefore it is difficult to apply the art to a small-sized device. Application of the art to the use where the heating value of a semiconductor integrated circuit chip drastically changes depending on the operation state of the chip also involves difficulty.

According to the art described in patent document 3 (JP-A-5-63315), a delay pad is easy to delete, but difficult to add and thus it is difficult to increase the delay time although the once set delay time can be decreased. A design must be prepared so that the capacitive load fits into the board, and the process management cost for the purpose occurs. The method is unsuitable for a semiconductor integrated circuit of high density mounting.

According to the art described in patent document 4 (Japanese Patent No. 3415830), capacitive load is separated by laser beam cutting to adjust the delay time and thus the once set delay time can be decreased, but cannot be increased. Facilities for measuring the delay time and a laser for cutting the capacitive load from the outside are also necessary.

According to the art described in patent document 5 (JP-A-2004-356251), an insulating material must be selected to obtain any desired delay time and the process management cost for obtaining any desired delay time occurs. After manufacturing, the delay time cannot be changed or adjusted.

According to the art described in patent document 6 (JP-A-11-135920), a waveform observation terminal and a clock input circuit become a stub structure and thus reflection of a signal occurs because of the stub structure and the signal quality worsens. Since it is impossible to match the output impedance of a clock output circuit and the characteristic impedance of a clock path, the method is unsuitable for high-frequency signal transmission.

SUMMARY

Exemplary embodiments of the present invention provide a delay circuit and a delay time adjustment method capable of easily adjusting and changing the delay time of signal propagation of wiring of a wiring board of a mount board, a semiconductor package, etc., and also covering miniaturization and high density mounting of a wiring board.

To accomplish the object, according to a delay time adjustment method according to the invention, the delay time can be set for a delay device that is provided as a delay circuit at the input end and the output end of the wiring of the wiring board and can be set to any desired delay time based on signal propagation time previously measured about wiring of the wiring board to set the delay time, whereby the delay time of the signal propagation of the wiring of the wiring board is adjusted.

More particularly, according to a first aspect of the invention, there is provided a delay time adjustment method including a transmitting step of transmitting a propagation time measuring signal from a terminal to which a delay circuit is to be connected, of the wiring of the wiring board to set the delay time to the wiring of the wiring board to set the delay time in a measurement mode; a receiving step of receiving the propagation time measuring signal reflected on the wiring of the wiring board to set the delay time in the measurement mode; a measuring step of calculating the time difference between the time at which the propagation time measuring signal is received in the receiving step and the time at which the propagation time measuring signal is transmitted in the transmitting step and measuring the half time of the time difference as the signal propagation time about the wiring of the wiring board to set the delay time in the measurement mode; a calculating step of determining that the time difference between the maximum one of the signal propagation times measured about the wiring of the wiring board and the signal propagation time measured about the wiring of the wiring board to set the delay time is the delay time of the wiring of the wiring board to set the delay time; and a setting step of setting the delay time determined in the calculating step for a delay device that is provided as the delay circuit connected to the wiring of the wiring board and can be set to any desired delay time.

According to a second aspect of the invention, there is provided a delay time adjustment method including a transmitting step of transmitting a propagation time measuring signal from a measuring terminal provided on the wiring board to set the delay time to measuring reference wiring connected to the measuring terminal in a measurement mode; a receiving step of receiving the propagation time measuring signal reflected on the measuring reference wiring in the measurement mode; a measuring step of calculating the time difference between the time at which the propagation time measuring signal is received in the receiving step and the time at which the propagation time measuring signal is transmitted in the transmitting step and measuring the half time of the time difference as the signal propagation time about the measuring reference wiring in the measurement mode; a calculating step of determining that the time difference between the maximum one of the signal propagation times about the wiring of the wiring board estimated using the signal propagation time about the measuring reference wiring from the ratio between the design length of the wiring of the wiring board to set the delay time and the length of the measuring reference wiring and the signal propagation time estimated about the wiring of the wiring board to set the delay time is the delay time of the wiring of the wiring board to set the delay time; and a setting step of setting the delay time for a delay device that is provided as a delay circuit connected to the wiring of the wiring board and can be set to any desired delay time.

According to the invention, a delay circuit for adjusting the delay time of signal propagation of wiring of a wiring board includes an interface for giving a command of setting a delay time and a delay device that can be set to any desired delay time, and the delay time of the delay device is set according to a command from the interface. The interface is a JTAG (Joint Test Action Group) interface, for example. The JTAG interface is described later.

More particularly, according to the first aspect of the invention, there is provided a delay circuit including a delay device that is connected to the input end and the output end of the wiring of the wiring board and can be set to any desired delay time. The delay device has a signal generator for transmitting a propagation time measuring signal to the wiring of the wiring board to set the delay time in a measurement mode; a reception section for receiving the propagation time measuring signal reflected on the wiring of the wiring board to set the delay time in the measurement mode; a measurement section for measuring the time difference between the time at which the reception section receives the propagation time measuring signal and the time at which the signal generator transmits the propagation time measuring signal and setting the half time of the time difference as the signal propagation time about the wiring of the wiring board to set the delay time in the measurement mode; and a calculation section for determining that the time difference between the maximum one of the signal propagation times measured about the wiring of the wiring board and the signal propagation time measured about the wiring of the wiring board to set the delay time is the delay time of the wiring of the wiring board to set the delay time.

The delay circuit according to the first aspect of the invention is provided on the wiring board mounting the wiring to set the delay time. A wiring board provided with the delay circuit according to the first aspect of the invention and a wiring board provided with the delay circuit according to the first aspect of the invention are connected through the delay circuits, whereby the signal propagation time about the wiring of one wiring board is measured and an appropriate delay time is set using the measured signal propagation time.

According to the second aspect of the invention, there is provided a delay circuit including a delay device that is connected to the input end and the output end of the wiring of the wiring board and can be set to any desired delay time and a measuring device for measuring the signal propagation time of measuring reference wiring provided on the wiring board to set the delay time. The measuring device has a signal generator for transmitting a propagation time measuring signal to the measuring reference wiring connected to the measuring device in a measurement mode; a reception section for receiving the propagation time measuring signal reflected on the measuring reference wiring in the measurement mode; a measurement section for measuring the time difference between the time at which the reception section receives the propagation time measuring signal and the time at which the signal generator transmits the propagation time measuring signal and setting the half time of the time difference as the signal propagation time about the measuring reference wiring in the measurement mode; and a calculation section for determining that the time difference between the maximum one of the signal propagation times about the wiring of the wiring board estimated using the signal propagation time about the measuring reference wiring from the ratio between the design length of the wiring of the wiring board to set the delay time and the length of the measuring reference wiring and the signal propagation time estimated about the wiring of the wiring board to set the delay time is the delay time of the wiring of the wiring board to set the delay time.

The delay circuit according to the second aspect of the invention is provided on the wiring board mounting the wiring to set the delay time. Measuring reference wiring is further provided on a wiring board provided with the delay circuit according to the second aspect of the invention. The signal propagation time about the measuring reference wiring is measured and an appropriate delay time is set using the measured signal propagation time.

In the first and second aspects of the invention described above, if the wiring board is a mount board where a plurality of semiconductor packages are installed, for example, the wiring of the wiring board corresponds to wiring of the mount board for connecting the semiconductor packages. In this case, since a semiconductor chip is installed in each semiconductor package, the wiring of the wiring board corresponds to the wiring of the mount board for connecting the semiconductor chips.

As another example, if the wiring board is a semiconductor package where a plurality of semiconductor chips are installed, the wiring of the wiring board corresponds to wiring of the semiconductor package for connecting the semiconductor chips.

According to the invention, the delay time of signal propagation of wiring of a wiring board can be set according to an electronic technique, so that the delay time can be easily adjusted and can be changed repeatedly. According to the invention, skew of the wiring board can be easily measured and a highly accurate delay circuit can be easily configured based on the measurement result. Further, a delay circuit also capable of covering miniaturization and high density mounting of a wiring board can be implemented.

According to the invention, if a circuit for giving an execution command of processing for adjusting and changing the delay time of the delay circuit is provided on the wiring board and is connected to the JTAG interface in the delay circuit, the delay time of the delay circuit can be easily set or changed through the JTAG interface.

The invention eliminates the need for making preparations for a delay element for each delay time as in the art described in patent document 1 (JP-A-5-175415) and also eliminates the fear of causing a contact failure to occur because an electric contact for placing a delay element in a delay element housing section does not exist.

The invention eliminates the need for a mechanism for keeping the temperature on the periphery of a wiring board constant and the effect of ambient temperature change is hard to receive because adjusting the delay time by adjusting the heat release from a radiation lead line as in the art described in patent document 2 (JP-A-8-125073) is not performed.

The invention eliminates the need for mounting a passive element of capacitive load, a meander pattern, etc., on a wiring board as in the art described in patent document 3 (JP-A-5-63315) or the art described in patent document 4 (Japanese Patent No. 3415830), so that the wiring space can be used effectively and the invention can also be applied to a wiring board of high density mounting.

According to the first aspect of the invention, a wiring board provided with the delay circuit and a wiring board provided with the delay circuit are connected through the delay circuits, whereby the signal propagation time about the wiring of one wiring board is measured and an appropriate delay time is set using the measured signal propagation time, so that an external special jig or measuring apparatus for adjusting or changing the delay time is not required.

According to the second aspect of the invention, the delay circuit and the measuring reference wiring are provided on the wiring board mounting the wiring to set the delay time. Thus, it is not necessary to connect the wiring boards each provided with the delay circuit through the delay circuits as in the first aspect of the invention, and the delay time of the wiring board can be further easily adjusted. The signal propagation time of wiring on a wiring board varies depending on the ambient heat. However, the measuring reference wiring is provided on the wiring board mounting the wiring to set the delay time, so that it can be said that the variation coefficient based on the heat is almost the same between the signal propagation time of the measuring reference wiring and the signal propagation time of the wiring to set the delay time and therefore it is possible to set the delay time hard to receive the effect of ambient heat change.

Other features and advantages may be apparent from the following detailed description, the accompanying drawings and the claims.

DETAILED DESCRIPTION

Figure 1:
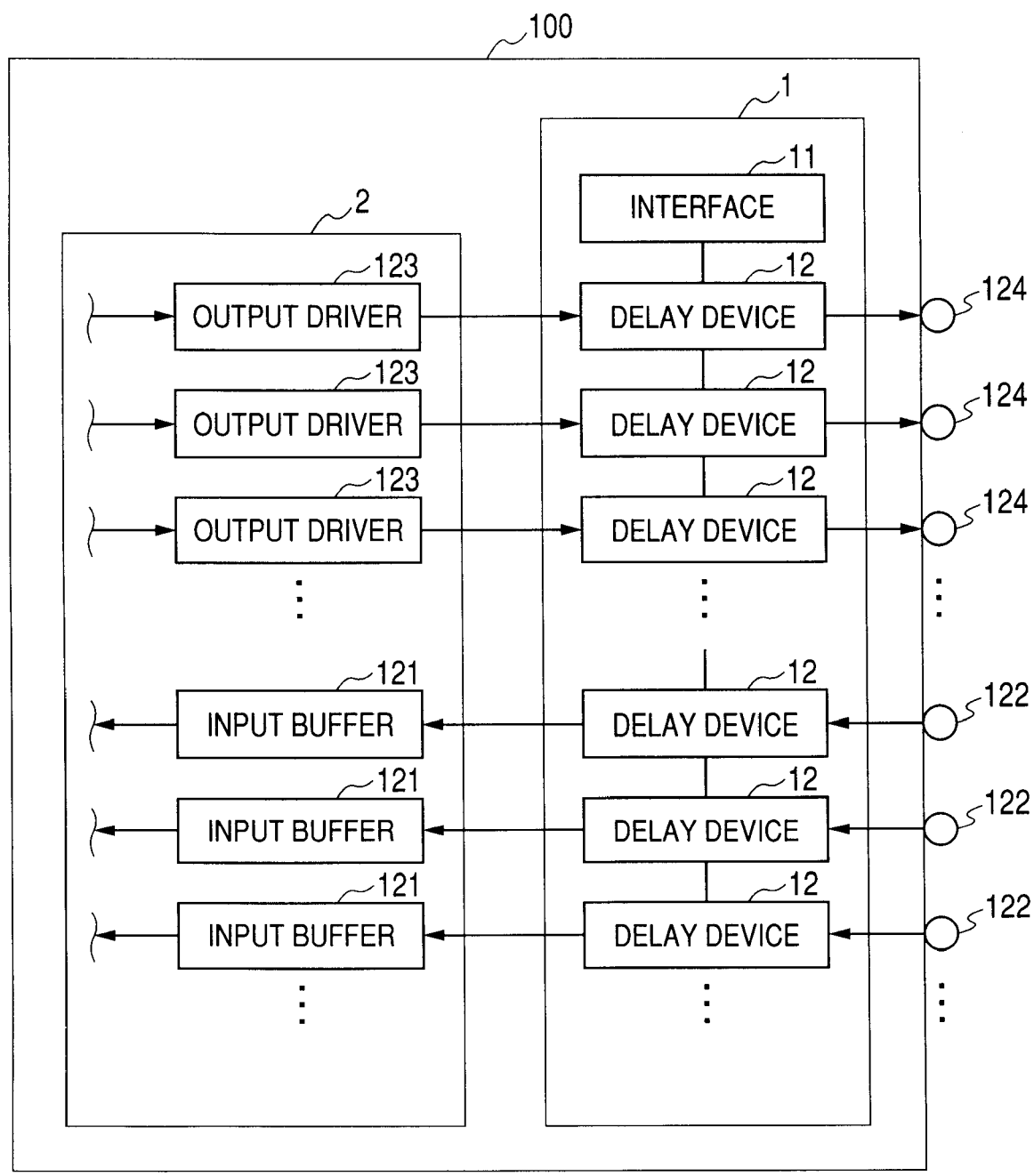
FIG. 1 is a drawing to show a mount example of a delay circuit according to a first embodiment of the invention on a wiring board.

As described above, in the invention, if a wiring board is a mount board where a plurality of semiconductor packages are installed, for example, wiring to set a delay time provided on the wiring board corresponds to wiring of the mount board for connecting the semiconductor packages. In this case, since a semiconductor chip is installed in each semiconductor package, the wiring of the wiring board corresponds to the wiring of the mount board for connecting the semiconductor chips. If a wiring board is a semiconductor package where a plurality of semiconductor chips are installed, for example, wiring to set a delay time provided on the wiring board corresponds to wiring of the semiconductor package for connecting the semiconductor chips. That is, the wiring of the wiring board to set a delay time section the wiring for connecting the semiconductor chips regardless of whether the wiring board is the mount board or the semiconductor package.

In the description to follow, components denoted by the same reference numerals in the accompanying drawings are components having the identical function.

Figure 2:
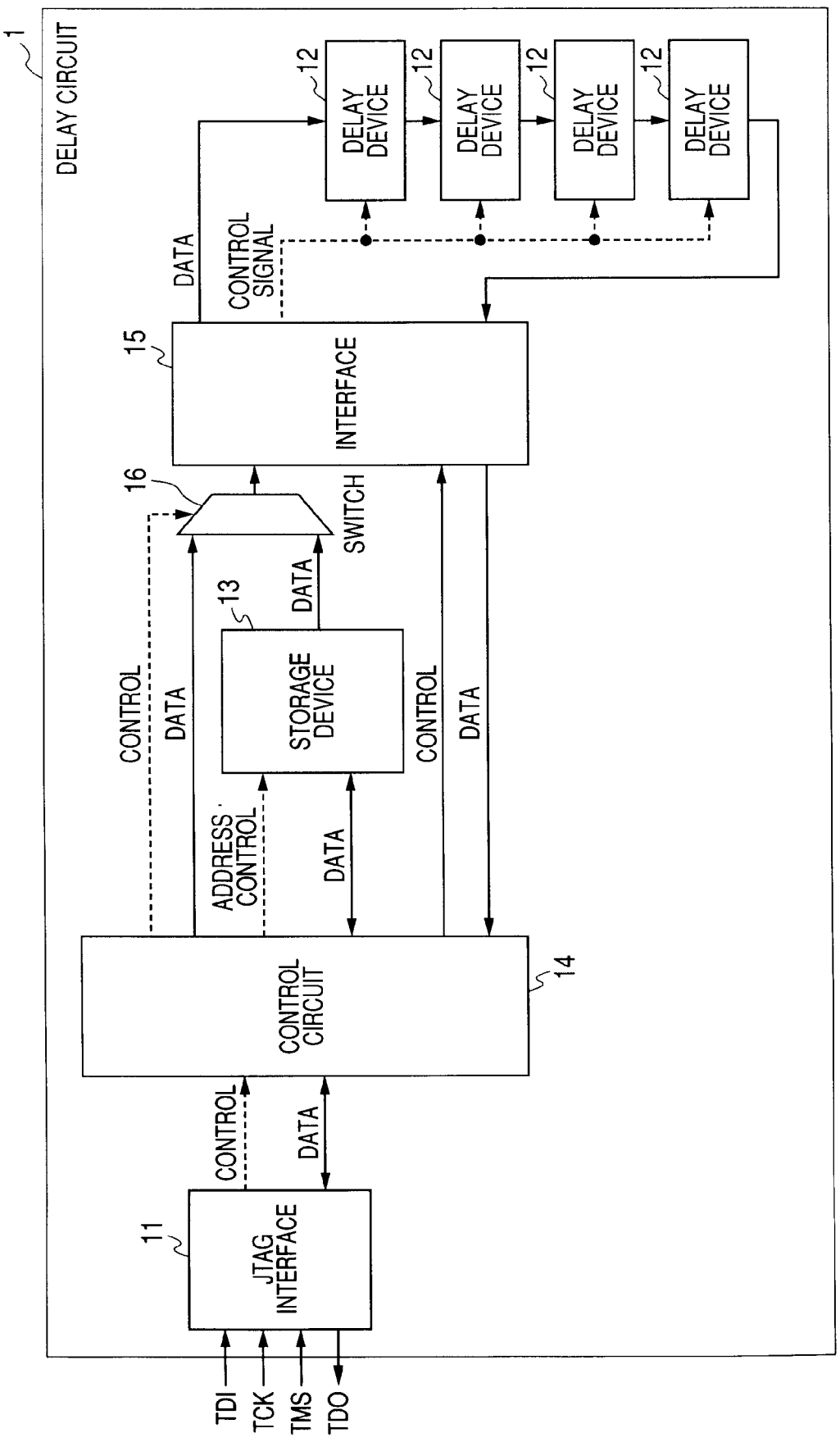
FIG. 2 is a basic block diagram to show the delay circuit according to the first embodiment of the invention.
Figure 3:
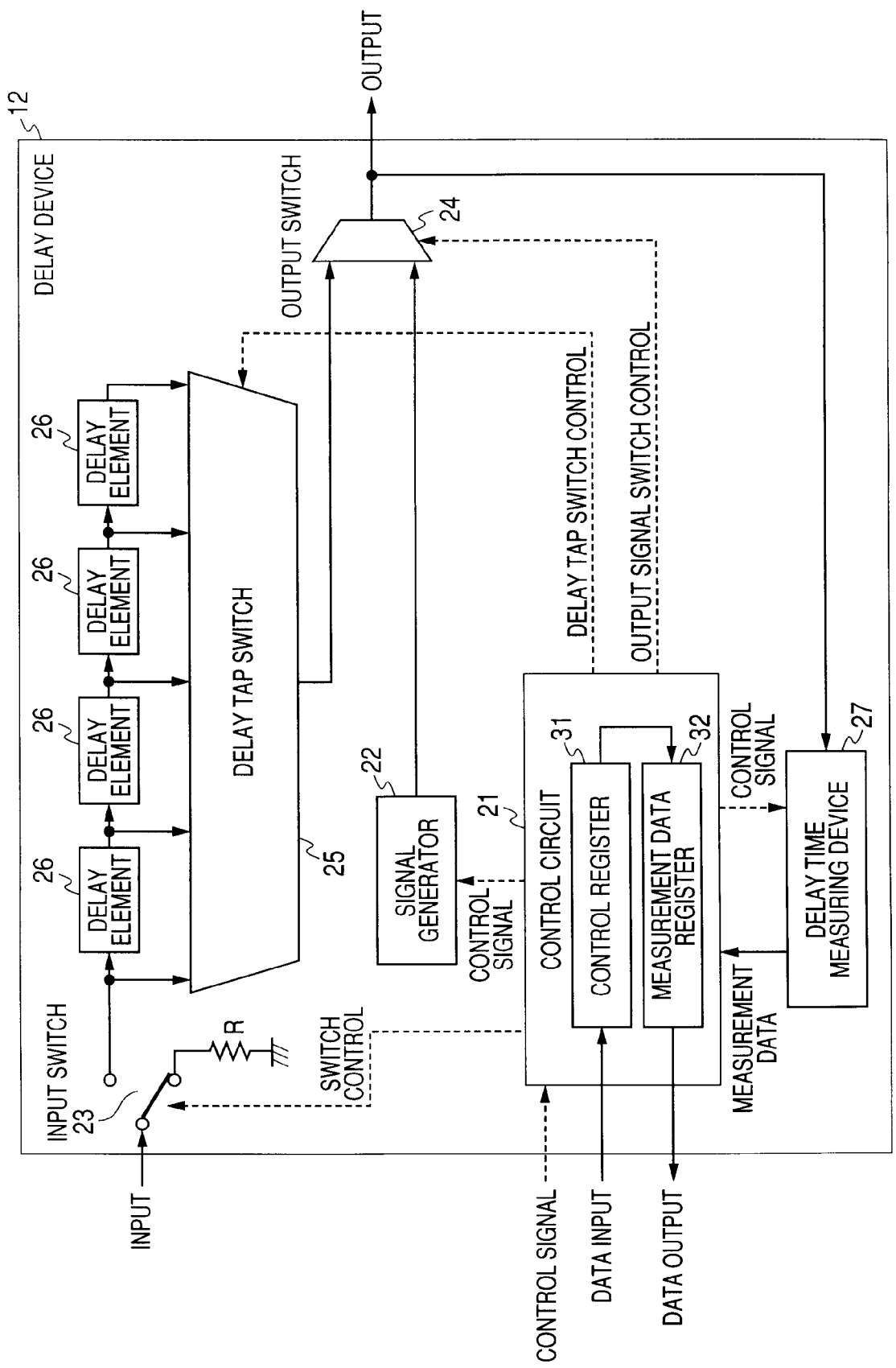
FIG. 3 is a basic block diagram to show a delay device in the delay circuit according to the first embodiment of the invention shown in FIG. 2.

FIG. 1 is a drawing to show a mount example of a delay circuit according to a first embodiment of the invention on a wiring board. In FIGS. 1 to 3, wiring to set a delay time provided on the wiring board will be discussed collectively as wiring for connecting semiconductor chips on the wiring board.

A delay circuit 1 according to the first embodiment of the invention includes an interface 11 for giving a command of setting a delay time and delay devices 12 that can be set to any desired delay time, and the delay time of the delay device 12 is set according to a command from the interface 11. The interface 11 is a JTAG (Joint Test Action Group) interface. The JTAG is the standard of Boundary Scan Test, one of IC chip inspection methods. In the Boundary Scan Test in the JTAG, TAP (Test Access Port) terminals of the ICs to be inspected are daisy-chained and a plurality of Ices can be read in order for inspection.

The delay devices 12 are connected in series by a JTAG chain. If a circuit for giving an execution command of adjusting and changing the delay time of the delay circuit is provided on the wiring board and is connected to the JTAG interface 11 in the delay circuit 1, the delay time of each delay device 12 in the delay circuit 1 can be easily set or changed through the JTAG interface 11. Each delay device 12 is connected to the input end and the output end of wiring for connecting semiconductor chips 2 on a wiring board 100. In the illustrated example, the semiconductor chip 2 is mounted on the wiring board 100 and the input terminal is denoted by numeral 122 and the output terminal is denoted by numeral 124. The delay devices 12 are provided between an input buffer 121 of the semiconductor chip 2 and the input terminal 122 and between an output driver 123 of the semiconductor chip 2 and the output terminal 124.

FIG. 2 is a basic block diagram to show the delay circuit according to the first embodiment of the invention. The connection lines to the semiconductor chip as shown in FIG. 1 are not shown in FIG. 2.

As shown in FIG. 2, the delay circuit 1 includes the JTAG interface 11 for giving a command of setting a delay time, the delay devices 12 that can be set to any desired time, a storage device 13 for storing a parameter for defining a delay time, a control circuit 14 for controlling the operation of the delay circuit 1, an interface 15, and a switch 16.

As previously described with reference to FIG. 1, the delay devices 12 are connected in series by a JTAG chain and each delay device 12 is provided for each wiring piece of the semiconductor chip. The number of the delay devices shown in the figure does not limit the invention and may be any other number.

The storage device 13 stores a parameter for defining the delay time for each delay device 12. Acquisition processing of the parameter for defining the delay time is described later. When power of the wiring board is turned on, power is also supplied to the delay circuit 1 and the control circuit 14 reads the parameter for defining the delay time for each delay device 12 from the storage device 13 and sets the delay time of each delay device 12.

The acquisition processing of the parameter for defining the delay time in a measurement mode for measuring the signal propagation time of wiring between semiconductor chips will be discussed. To mount a plurality of semiconductor chips on a wiring board, skew occurs due to the difference in the wiring lengths of the wiring for connecting the relevant semiconductor chips. Usually, the skew can be found by calculation in the design work of a wiring board, and the delay time is set based on the calculation result. In contract, in the invention, the skew is actually found using a measurement section provided in each delay device, and the delay time is set based on the measurement result. FIG. 3 is a basic block diagram to show the delay device in the delay circuit according to the first embodiment of the invention shown in FIG. 2. The connection lines to the semiconductor chip as shown in FIG. 1 are not shown in FIG. 3.

In the measurement mode for measuring the signal propagation time of wiring for connecting semiconductor chips, the delay device 12 in the delay circuit according to the first embodiment of the invention is also connected to the input terminal and the output terminal of wiring for connecting the semiconductor chips on the wiring board.

First, an output switch 24 in the delay device 12 connected to "one" terminal (which will be hereinafter referred to as "first terminal" for convenience) of wiring between the semiconductor chips to set a delay time is switched from a delay tap switch 25 to a signal generator 22 under the control of a control circuit 21 in the delay device 12. Accordingly, a propagation time measuring signal generated by the signal generator 22 is output from the output terminal of the delay device 12 connected to the first terminal of the wiring between the semiconductor chips to set the delay time.

On the other hand, an input switch 23 in the delay device 12 connected to "another" terminal (which will be hereinafter referred to as "second terminal" for convenience) of the wiring between the semiconductor chips to set the delay time is switched to the side connected to ground via a resistor R under the control of the control circuit 21 in the delay device 12. The resistance value of the resistor R is set to a sufficiently high value relative to a specific impedance of the wiring pattern on the wiring board. Accordingly, for the signal input to the delay device 12 connected to the second terminal of the wiring between the semiconductor chips to set the delay time, the function of signal reflection section for reflecting the signal is implemented.

The control circuit 21 in the delay device 12 connected to the first terminal of the wiring between the semiconductor chips to set the delay time controls the signal generator 22 so as to generate a propagation time measuring signal in a state in which the output switch 24 in the delay device 12 connected to the first terminal of the wiring between the semiconductor chips to set the delay time and the input switch 23 in the delay device 12 connected to the second terminal of the wiring between the semiconductor chips to set the delay time are switched as described above. The propagation time measuring signal is a pulse signal, for example. At this timing, the control circuit 21 notifies a delay time measuring device 27 that the propagation time measuring signal has been generated. Upon reception of the notification, the delay time measuring device 27 starts counting the time.

The propagation time measuring signal generated by the signal generator 22 in the delay device 12 connected to the first terminal passes through the first terminal, propagates on the wiring between the semiconductor chips to set the delay time, and passes through the second terminal and then arrives at the delay device 12 connected to the second terminal. Then, the propagation time measuring signal input to the delay device 12 connected to the second terminal is reflected on the signal reflection section, again propagates on the wiring between the semiconductor chips to set the delay time, and passes through the first terminal and then arrives at the delay device 12 connected to the first terminal.

The delay device 12 connected to the first terminal receives at the delay time measuring device 27, the propagation time measuring signal passed through the wiring between the semiconductor chips and reflected on the signal reflection section in the delay device 12 connected to the second terminal and returned. The delay time measuring device 27 stops counting the time at the reception timing. Accordingly, the time difference between the time at which the delay time measuring device 27 receives the propagation time measuring signal and the time at which the signal generator 22 transmits the propagation time measuring signal is measured. This measurement data is sent to the control circuit 21, which then writes the received measurement data into a measurement data register 32.

This processing is executed for each relevant wiring piece for connecting the semiconductor chips. The measurement data for each wiring piece is acquired by a component involved in acquiring the measurement data in the corresponding delay device and is written into the measurement data register 32 in the delay device. The measurement data written into the measurement data register 32 in each delay device 12 is read via a "DATA output" line in FIG. 3 using a control register 31 through the JTAG interface 11 previously described with reference to FIG. 2.

The read measurement data indicates the time difference between the time at which the delay time measuring device 27 receives the propagation time measuring signal and the time at which the signal generator 22 transmits the propagation time measuring signal as described above. The half time of the time difference is the signal propagation time about the wiring between the semiconductor chips to set the delay time. The control circuit 14 in FIG. 2 keeps track of the maximum one of the signal propagation times measured about each wiring piece between the semiconductor chips obtained through the interface 15. The control circuit 14 in FIG. 2 determines that the time difference between the maximum signal propagation time and the signal propagation time measured about the wiring between the semiconductor chips to set the delay time is the delay time of the wiring to set the delay time.

Each parameter for defining the delay time determined about each wiring piece for connecting the semiconductor chips is stored in the storage device 13 in the delay circuit 1 and the measurement mode is now complete.

After completion of the measurement mode, the mode is returned to the usual mode. In the usual mode, when power of the wiring board is turned on, power is also supplied to the delay circuit 1 and the control circuit 14 reads the parameter for defining the delay time for each delay device 12 from the storage device 13 and sets the delay time of each delay device 12. Processing in the usual mode will be discussed below:

In the usual mode, in each delay device 12, the input switch 23 switches connection from the side connected to ground via the resistor R to the side where delay elements 26 and the delay tap switch 25 are connected under the control of the control circuit 21. Likewise, the output switch 24 switches connection from the signal generator 22 to the delay tap switch 25 under the control of the control circuit 21.

The parameter concerning the delay time of each delay device 12 stored in the storage device 13 is read according to a command from the JTAG interface 11 in FIG. 1 and is sent to the corresponding delay device 12 via the DATA line through the switch 16 and the interface 15. In each delay device 12, the control circuit 21 controls the delay tap switch 25 based on the received parameter concerning the delay time and switches a tap of the delay tap switch 25 so as to select as many delay elements 26 as the number of the delay elements 26 that can provide the necessary delay time. Each of the delay elements 26 generates a predetermined delay amount electrically; it is an LC passive element by way of example. The number of the delay elements shown in the figure does not limit the invention and may be any other number. If the value of the delay amount generated by each delay element 26 is lessened and then the number of the delay elements 26 is increased, the delay time can be set with higher accuracy.

As the processing sequence described above is performed, the optimum delay time is set (programmed) for each of the delay devices provided as the delay circuit at the input end and the output end of each wiring piece between the semiconductor chips based on the signal propagation time measured about each wiring piece between the semiconductor chips of the wiring to set the delay time on the wiring board.

The input pin of the JTAG interface 11 can also be used appropriately to read the measured signal propagation time about each wiring piece between the semiconductor chips and the setup delay time about each wiring piece between the semiconductor chips to the outside through the JTAG interface 11.

Next, mounting the delay circuit according to the first embodiment of the invention on a wiring board will be discussed. Here, it is assumed that a delay circuit chip is provided in the form of a semiconductor chip formed with a delay circuit containing delay devices made of LC passive elements on a semiconductor substrate (silicon) byway of example. The delay circuit according to the first embodiment of the invention may be provided in a semiconductor chip.

Figure 4:
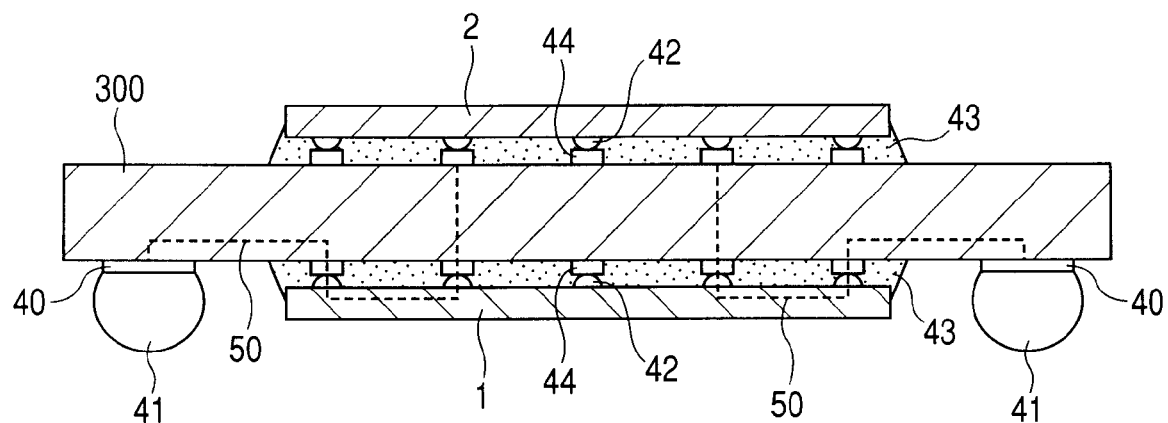
FIG. 4 is a sectional view to illustrate a first example of mounting the delay circuit according to the first embodiment of the invention on a wiring board.

FIG. 4 is a sectional view to illustrate a first example of mounting the delay circuit according to the first embodiment of the invention on a wiring board. In the illustrated example, the delay circuit chip 1 according to the first embodiment of the invention is mounted on a first face of a semiconductor package 300 and the semiconductor chip 2 is mounted on an opposite face. Each of the input/output terminals of the delay circuit chip 1 and the semiconductor chip 2 is implemented as one of bumps 42 of each chip. The input/output terminals of the semiconductor package 300 are implemented as solder balls 41 on lands 40. Electric wiring 50 from the semiconductor chip 2 in the semiconductor package 300 on which the semiconductor chip 2 is mounted is connected to the solder balls 41 through the delay circuit chip 1 and is indicated by the dashed lines in the figure. In the figure, numeral 43 denotes seal resin and numeral 44 denotes a pad.

Figure 5:
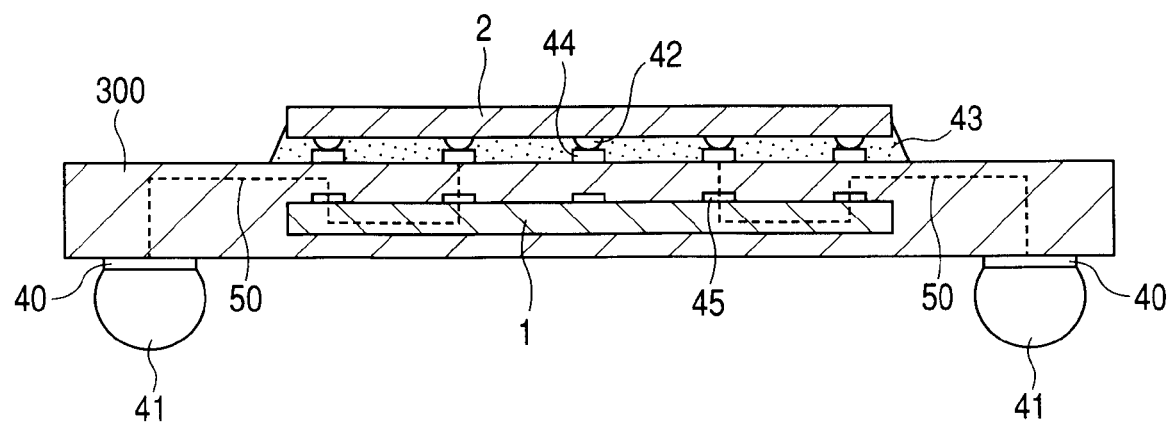
FIG. 5 is a sectional view to illustrate a second example of mounting the delay circuit according to the first embodiment of the invention on a wiring board.

FIG. 5 is a sectional view to illustrate a second example of mounting the delay circuit according to the first embodiment of the invention on a wiring board. In the illustrated example, the delay circuit chip 1 according to the first embodiment of the invention is mounted in the semiconductor package 300 where the semiconductor chip 2 is mounted, namely, is embedded in the wiring board of the semiconductor package. Other components are similar to those of the first example of mounting the delay circuit on the wiring board previously described with reference to FIG. 4. That is, each of the input/output terminals of the delay circuit chip 1 and the semiconductor chip 2 is made up of an electrode 45 of the delay circuit chip 1 and one of bumps 42 of the semiconductor chip 2. The input/output terminals of the semiconductor package 300 are implemented as solder balls 41 on lands 40. Electric wiring 50 from the semiconductor chip 2 in the semiconductor package 300 on which the semiconductor chip 2 is mounted is connected to the solder balls 41 through the delay circuit chip 1 and is indicated by the dashed lines in the figure. In the figure, numeral 43 denotes seal resin and numeral 44 denotes a pad.

Figure 6:
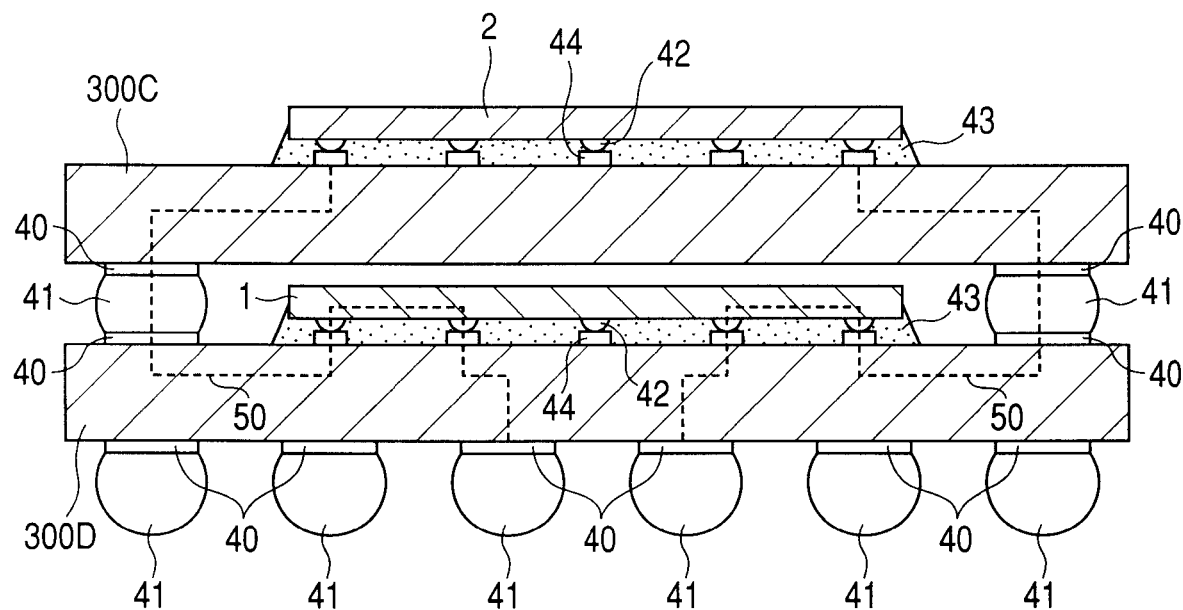
FIG. 6 is a sectional view to illustrate a third example of mounting the delay circuit according to the first embodiment of the invention on a wiring board.

FIG. 6 is a sectional view to illustrate a third example of mounting the delay circuit according to the first embodiment of the invention on a wiring board. In the illustrated example, the delay circuit chip 1 according to the first embodiment of the invention is mounted as package on package. That is, the delay circuit chip 1 according to the first embodiment of the invention is mounted on a semiconductor package 300D and the semiconductor chip 2 is mounted on a semiconductor package 300C. The semiconductor package 300C and the semiconductor package 300D are connected through solder balls 41 on lands 40 formed as the input/output terminals of the semiconductor packages. Other components are similar to those of the first example of mounting the delay circuit on the wiring board previously described with reference to FIG. 4. That is, electric wiring 50 from the semiconductor chip 2 in the semiconductor package 300C on which the semiconductor chip 2 is mounted is indicated by the dashed lines in the figure and is connected to the solder balls 41 on the lands 40 through the solder balls 41 for connecting the semiconductor package 300C and 300D, electric wiring 50 of the semiconductor package 300D, and the delay circuit chip 1. In the figure, numeral 43 denotes seal resin and numeral 44 denotes a pad.

Figure 7:
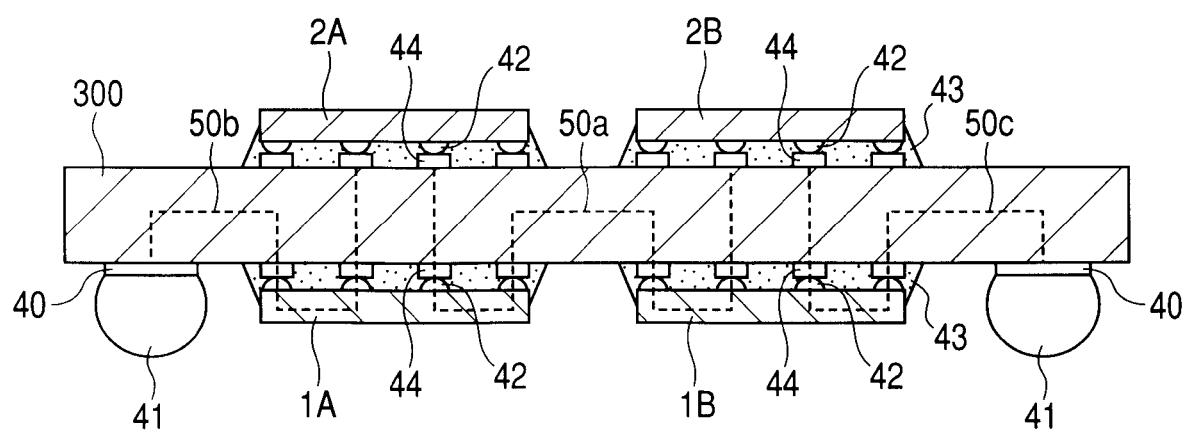
FIG. 7 is a sectional view to illustrate a fourth example of mounting the delay circuit according to the first embodiment of the invention on a wiring board.

FIG. 7 is a sectional view to illustrate a fourth example of mounting the delay circuit according to the first embodiment of the invention on a wiring board. In the illustrated example, a plurality of semiconductor chips are mounted on the semiconductor package 300. Semiconductor chips 2A and 2B are mounted on the semiconductor package 300. Delay circuit chips 1A and 1B according to the first embodiment of the invention are provided at the input/output ends of the semiconductor chips 2A and 2B; in the illustrated example, the delay circuit chips 1A and 1B according to the first embodiment of the invention are mounted on the opposite face to the side of the semiconductor package 300 where the semiconductor chips 2A and 2B are mounted. Each of the input/output terminals of the delay circuit chips 1A and 1B and the semiconductor chips 2A and 2B is implemented as one of bumps 42 of each chip. The input/output terminals of the semiconductor package 300 are implemented as solder balls 41 on lands 40. Electric wiring 50 from the semiconductor chip 2 in the semiconductor package 300 on which the semiconductor chip 2 is mounted is indicated by the dashed lines in the figure through the delay circuit chip 1. In the figure, numeral 43 denotes seal resin and numeral 44 denotes a pad. Wiring 50a is wiring of the semiconductor package 300 for connecting the semiconductor chips 2A and 2B; it connects the input/output terminals of the semiconductor chips 2A and 2B through the delay circuit chips 1A and 1B. The delay circuit chips 1A and 1B adjust the delay time of signal propagation of the wiring 50a. Wiring 50b is wiring of the semiconductor package 300 for connecting the semiconductor package 300 and a different semiconductor package; it is connected to the different semiconductor package through wiring on the mount board. The wiring 50b corresponds to the wiring 50 in FIG. 4. The input/output terminals of the semiconductor chips 2A and 2B and the solder balls 41 of the input/output terminals of the semiconductor package are connected through the delay circuit chips 1A and 1B.

Figure 8:
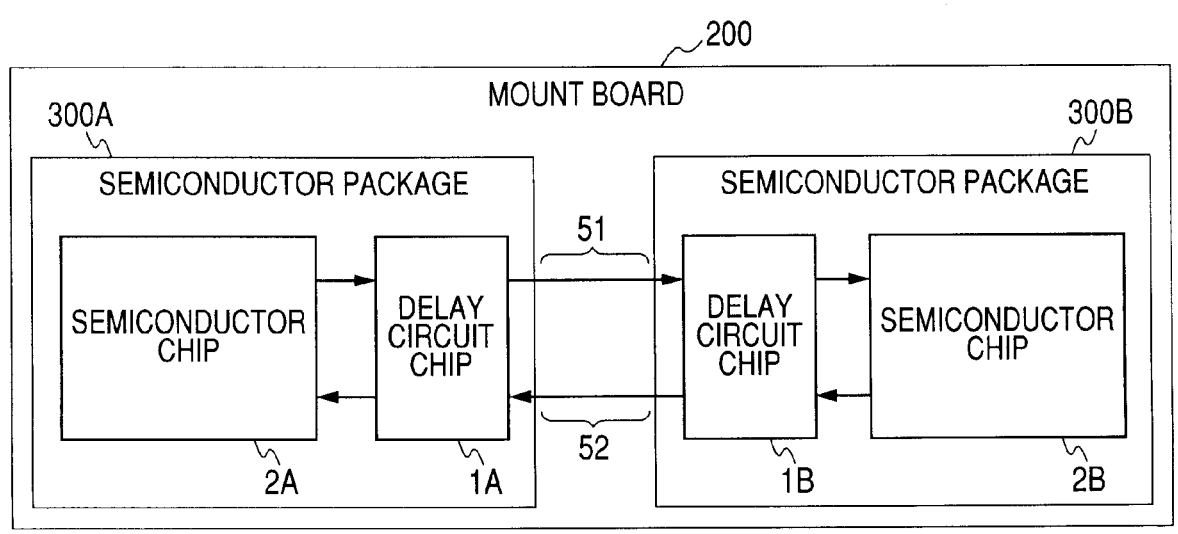
FIG. 8 is a schematic drawing to illustrate the case where the delay circuits according to the first embodiment of the invention are mounted on a mount board on which a plurality of semiconductor packages are installed for adjusting the delay time of wiring for connecting the semiconductor packages.

Next, the case where a wiring board is a mount board on which a plurality of semiconductor packages are installed will be discussed with reference to FIGS. 8 and 9. Here, the delay circuit according to the first embodiment of the invention is a delay circuit chip by way of example. FIG. 8 is a schematic drawing to illustrate the case where the delay circuits according to the first embodiment of the invention are mounted on a mount board on which a plurality of semiconductor packages are installed for adjusting the delay time of wiring for connecting the semiconductor packages.

Here, the case where semiconductor packages 300P and 300B are mounted on a mount board 200 and semiconductor chips 2A and 2B are mounted on the semiconductor packages 300A and 300B respectively is considered by way of example. The number of the semiconductor packages and the number of the semiconductor chips mounted on the mount board 200 shown in the figure do not limit the invention and each may be any other number.

The semiconductor chip 2A on the semiconductor package 300A and the semiconductor chip 2B on the semiconductor package 300B are electrically connected by wiring 51 and wiring 52 provided on the mount board 200. Skew occurs due to the wiring length difference between the wiring 51 and the wiring 52. Therefore, to adjust the delay time, the delay circuit chip 1A according to the first embodiment of the invention is provided at the input end and the output end of the semiconductor chip 2A on the semiconductor package 300A and the delay circuit chip 1B according to the first embodiment of the invention is provided at the input end and the output end of the semiconductor chip 2B on the semiconductor package 300B.

In the first embodiment of the invention, in the measurement mode, skew is actually found in a manner previously described using a measurement section (not shown) provided in each delay device (not shown) in each of the delay circuit chips 1A and 1B, and the delay time is set based on the measurement result. In the example in FIG. 8, a propagation time measuring signal output from the output terminal of the delay circuit chip 1A on the semiconductor package 300A passes through the wiring 51 provided on the mount board 200 and arrives at the input terminal of the delay circuit chip 1B on the semiconductor package 300B. Then, the propagation time measuring signal is reflected on the input terminal of the delay circuit chip 1B, passes through the wiring 51 provided on the mount board 200, and arrives at the output terminal of the delay circuit chip 1A. Accordingly, the signal propagation time of the wiring 51 to set the delay time is measured. On the other hand, a propagation time measuring signal output from the output terminal of the delay circuit chip 1B on the semiconductor package 300B passes through the wiring 52 provided on the mount board 200 and arrives at the input terminal of the delay circuit chip 1A on the semiconductor package 300A. Then, the propagation time measuring signal is reflected on the input terminal of the delay circuit chip 1A, passes through the wiring 52 provided on the mount board 200, and arrives at the output terminal of the delay circuit chip 1B. Accordingly, the signal propagation time of the wiring 52 to set the delay time is measured. The delay times of the wiring 51 and the wiring 52 of the mount board 200 are set according to a technique as previously described based on the measured signal propagation times of the wiring 51 and the wiring 52 to set the delay time. The measured signal propagation times of the wiring 51 and the wiring 52 contain the propagation time of the wiring from the input/output terminals of the semiconductor packages 300A and 300B to the delay circuit chips 1A and 1B. However, the propagation time can be ignored because the wiring lengths to the delay circuit chips 1A and 1B in the semiconductor packages 300A and 300B are extremely short as compared with the wiring lengths of the wiring 51 and the wiring 52 provided on the mount board 200.

Figure 9:
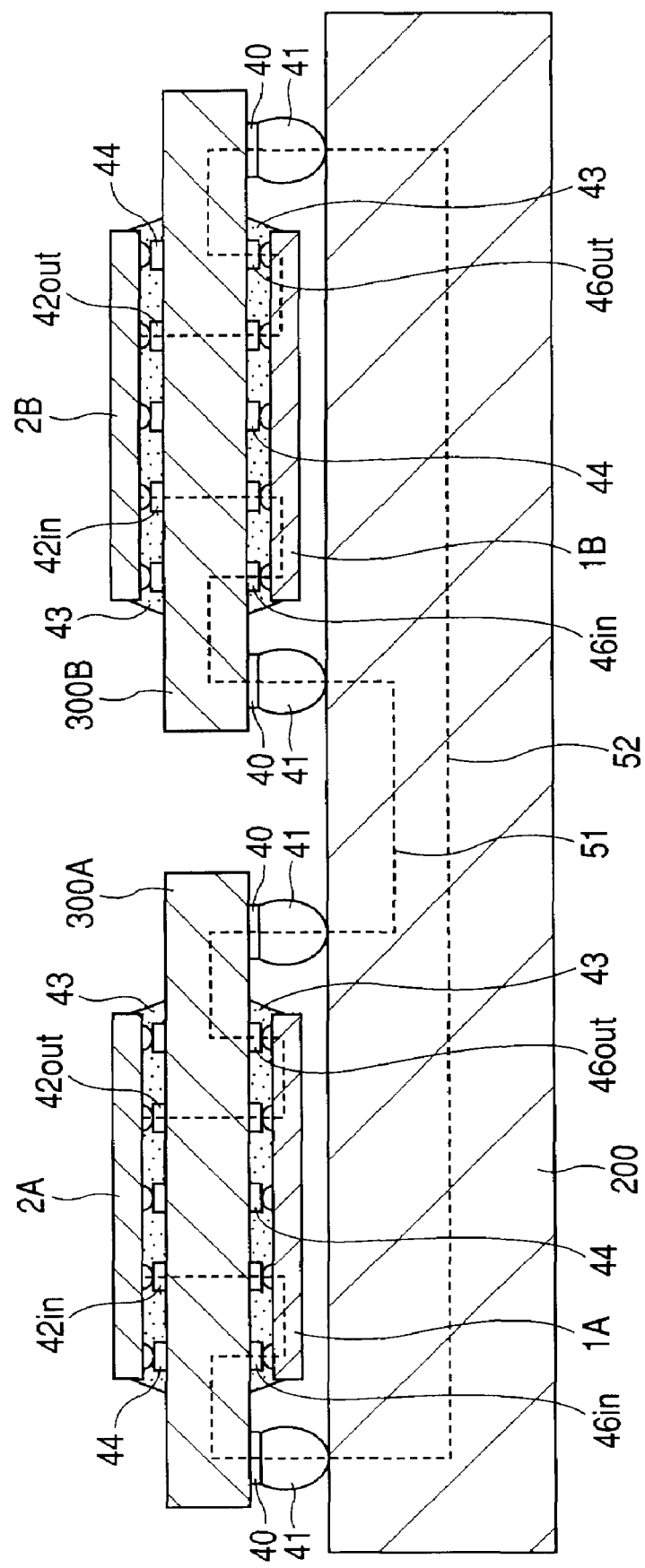
FIG. 9 is a sectional view to illustrate an example of mounting the delay circuits schematically shown in FIG. 8.

FIG. 9 is a sectional view to illustrate an example of mounting the delay circuits schematically shown in FIG. 8. The semiconductor packages 300A and 300B are mounted on the mount board 200. In the illustrated example, the delay circuit chips 1A and 1B according to the first embodiment of the invention are mounted according to the technique previously described with reference to FIG. 4. That is, the delay circuit chip 1A according to the first embodiment of the invention is mounted on one face of the semiconductor package 300A and the semiconductor chip 2A is mounted on the other face. The delay circuit chip 1B according to the first embodiment of the invention is mounted on one face of the semiconductor package 300B and the semiconductor chip 2B is mounted on the other face. The input terminals of the delay circuit chips 1A and 1B are implemented as bumps 46in, and the output terminals of the delay circuit chips 1A and 1B are implemented as bumps 46out. The input terminals of the semiconductor chips 2A and 2B are implemented as bumps 42in, and the output terminals of the semiconductor chips 2A and 2B are implemented as bumps 42out. The wiring 51 and the wiring 52 shown in FIG. 8 are indicated by dashed lines in FIG. 9. In this figure, numeral 43 denotes seal resin and numeral 44 denotes a pad. In the example shown in FIG. 9, the delay circuit chips 1A and 1B according to the first embodiment of the invention are mounted according to the technique previously described with reference to FIG. 4; as an alternative example, the delay circuit chips 1A and 1B may be mounted according to the technique previously described with reference to FIG. 5 or 6.

Figure 10:
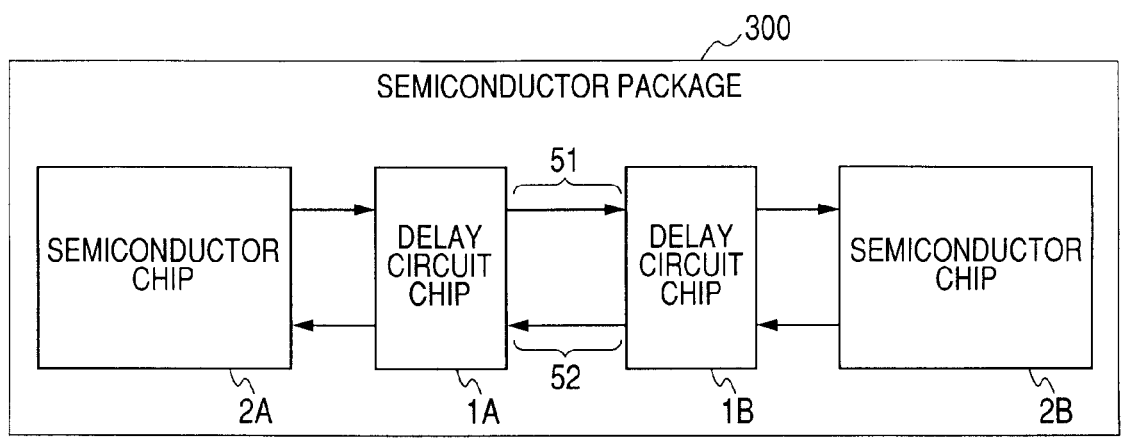
FIG. 10 is a schematic drawing to illustrate the case where the delay circuits according to the first embodiment of the invention are mounted on a semiconductor package on which a plurality of semiconductor chips are installed for adjusting the delay time of wiring of the semiconductor package for connecting the semiconductor chips.

Next, the case where a wiring board is a semiconductor package on which a plurality of semiconductor chips are installed will be discussed with reference to FIG. 10. The delay circuit according to the first embodiment of the invention is a delay circuit chip by way of example. FIG. 10 is a schematic drawing to illustrate the case where the delay circuits according to the first embodiment of the invention are mounted on a semiconductor package on which a plurality of semiconductor chips are installed for adjusting the delay time of wiring of the semiconductor package for connecting the semiconductor chips.

Here, the case where semiconductor chips 2A and 2B are mounted on a semiconductor package 300 is considered by way of example. The number of the semiconductor packages and the number of the semiconductor chips mounted on the semiconductor package 300 shown in the figure do not limit the invention and each may be any other number.

The semiconductor chips 2A and 2B are electrically connected by wiring 51 and wiring 52 provided on the semiconductor package 300. To mount them, for example, the technique previously described with reference to FIG. 7 may be applied. In this case, the wiring 50a in FIG. 7 corresponds to the wiring 51, 52 in FIG. 10. Skew occurs due to the wiring length difference between the wiring 51 and the wiring 52. Therefore, to adjust the delay time, the delay circuit chip 1A according to the first embodiment of the invention is provided at the input end and the output end of the semiconductor chip 2A on the semiconductor package 300 and the delay circuit chip 1B according to the first embodiment of the invention is provided at the input end and the output end of the semiconductor chip 2B.

In the first embodiment of the invention, in the measurement mode, skew is actually found in a manner previously described using a measurement section (not shown) provided in each delay device (not shown) in each of the delay circuit chips 1A and 1B, and the delay time is set based on the measurement result. In the example in FIG. 10, a propagation time measuring signal output from the output terminal of the delay circuit chip 1A on the semiconductor package 300 passes through the wiring 51 provided on the semiconductor package 300 and arrives at the input terminal of the delay circuit chip 1B. Then, the propagation time measuring signal is reflected on the input terminal of the delay circuit chip 1B, passes through the wiring 51 provided on the semiconductor package 300, and arrives at the output terminal of the delay circuit chip 1A. Accordingly, the signal propagation time of the wiring 51 to set the delay time is measured. On the other hand, a propagation time measuring signal output from the output terminal of the delay circuit chip 1B passes through the wiring 52 provided on the semiconductor package 300 and arrives at the input terminal of the delay circuit chip 1A. Then, the propagation time measuring signal is reflected on the input terminal of the delay circuit chip 1A, passes through the wiring 52 provided on the semiconductor package 300, and arrives at the output terminal of the delay circuit chip 1B. Accordingly, the signal propagation time of the wiring 52 to set the delay time is measured. The delay times of the wiring 51 and the wiring 52 of the semiconductor package 300 are set according to a technique as previously described based on the measured signal propagation times of the wiring 51 and the wiring 52 to set the delay time.

Figure 11:
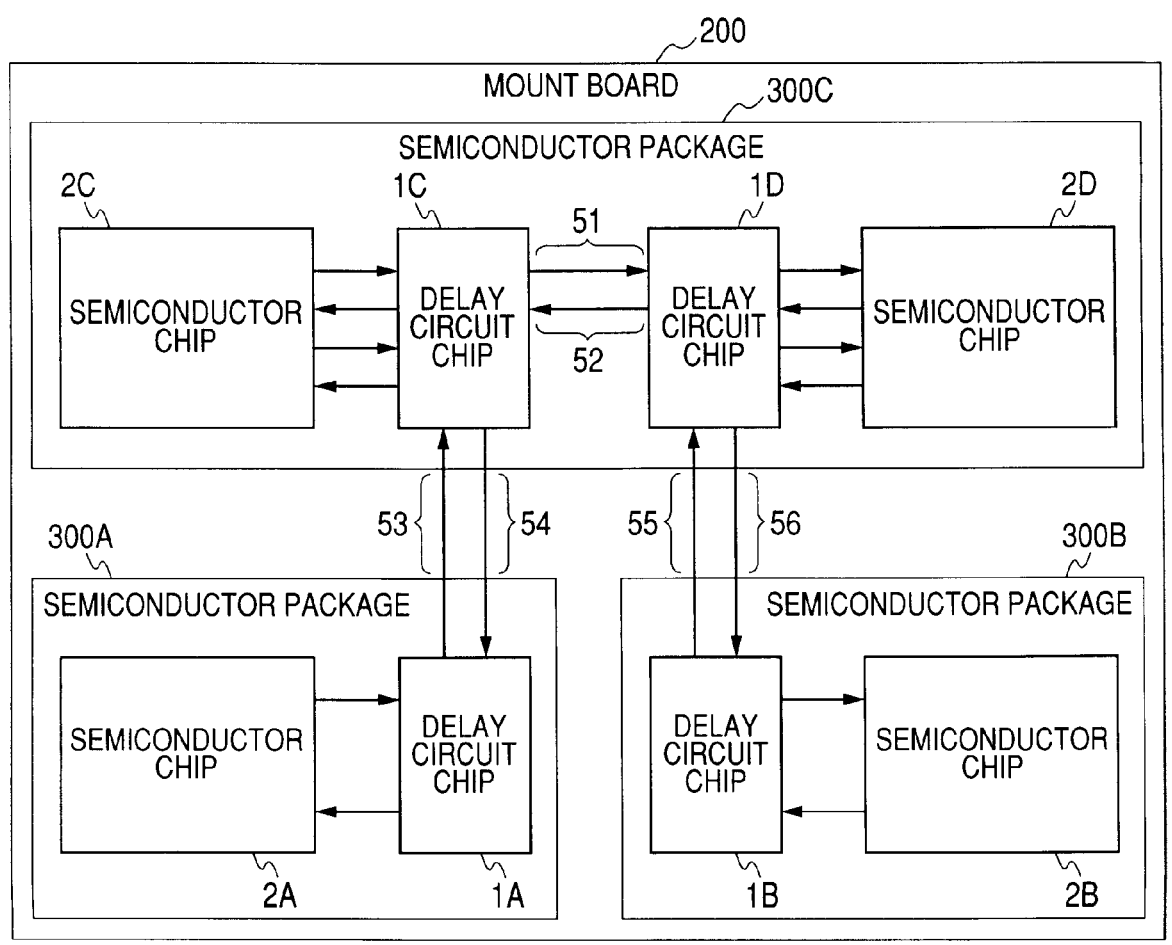
FIG. 11 is a schematic drawing to illustrate the case where the delay circuits according to the first embodiment of the invention are mounted on a mount board on which a plurality of semiconductor packages are mounted with a plurality of semiconductor chips mounted on one of the semiconductor packages for adjusting the delay time of wiring for connecting the semiconductor chips.

Next, the case where a wiring board is a mount board on which a plurality of semiconductor packages are mounted and a plurality of semiconductor chips are mounted on one of the semiconductor packages will be discussed with reference to FIG. 11. The delay circuit according to the first embodiment of the invention is a delay circuit chip by way of example. FIG. 11 is a schematic drawing to illustrate the case where the delay circuits according to the first embodiment of the invention are mounted on a mount board on which a plurality of semiconductor packages are mounted with a plurality of semiconductor chips mounted on one of the semiconductor packages for adjusting the delay time of wiring for connecting the semiconductor chips.

Here, the case where a semiconductor package 300A on which a semiconductor chip 2A is mounted, a semiconductor package 300B on which a semiconductor chip 2B is mounted, and a semiconductor package 300C on which semiconductor chips 2C and 2D are mounted are mounted on a mount board 200 is considered by way of example. The number of the semiconductor packages and the number of the semiconductor chips mounted on the mount board 200 shown in the figure do not limit the invention and each may be any other number.

The semiconductor chips 2C and 2D on the semiconductor package 300C are electrically connected by wiring 51 and wiring 52 provided on the semiconductor package 300C. To mount them, for example, the technique previously described with reference to FIG. 7 may be applied. In this case, the wiring 50a in FIG. 7 corresponds to the wiring 51, 52. The wiring 50b in FIG. 7 corresponds to wiring of the semiconductor package 300C connected to wiring 53, 54, 55, 56 of the mount board 200. The semiconductor chip 2A on the semiconductor package 300A is electrically connected to the semiconductor chip 2C on the semiconductor package 300C by wiring 53 and wiring 54 provided on the mount board 200. The semiconductor chip 2B on the semiconductor package 300B is electrically connected to the semiconductor chip 2D on the semiconductor package 300C by wiring 55 and wiring 56 provided on the mount board 200.

Skew occurs due to the wiring length difference between the wiring 51 and the wiring 52, between the wiring 53 and the wiring 54, and between the wiring 55 and the wiring 56. Therefore, to adjust the delay time, the delay circuit chips 1A, 1B, 1C, and 1D according to the first embodiment of the invention are provided at the input ends and the output ends of the semiconductor chips 2P, 2B, 2C, and 2D, as shown in the figure. In the invention, in the measurement mode, skew is actually measured using a measurement section (not shown) provided in each delay device (not shown) in each of the delay circuit chips 1A, 1B, 1C, and 1D, and the delay time is set based on the measurement result in a similar manner to that described above.

Figure 12:
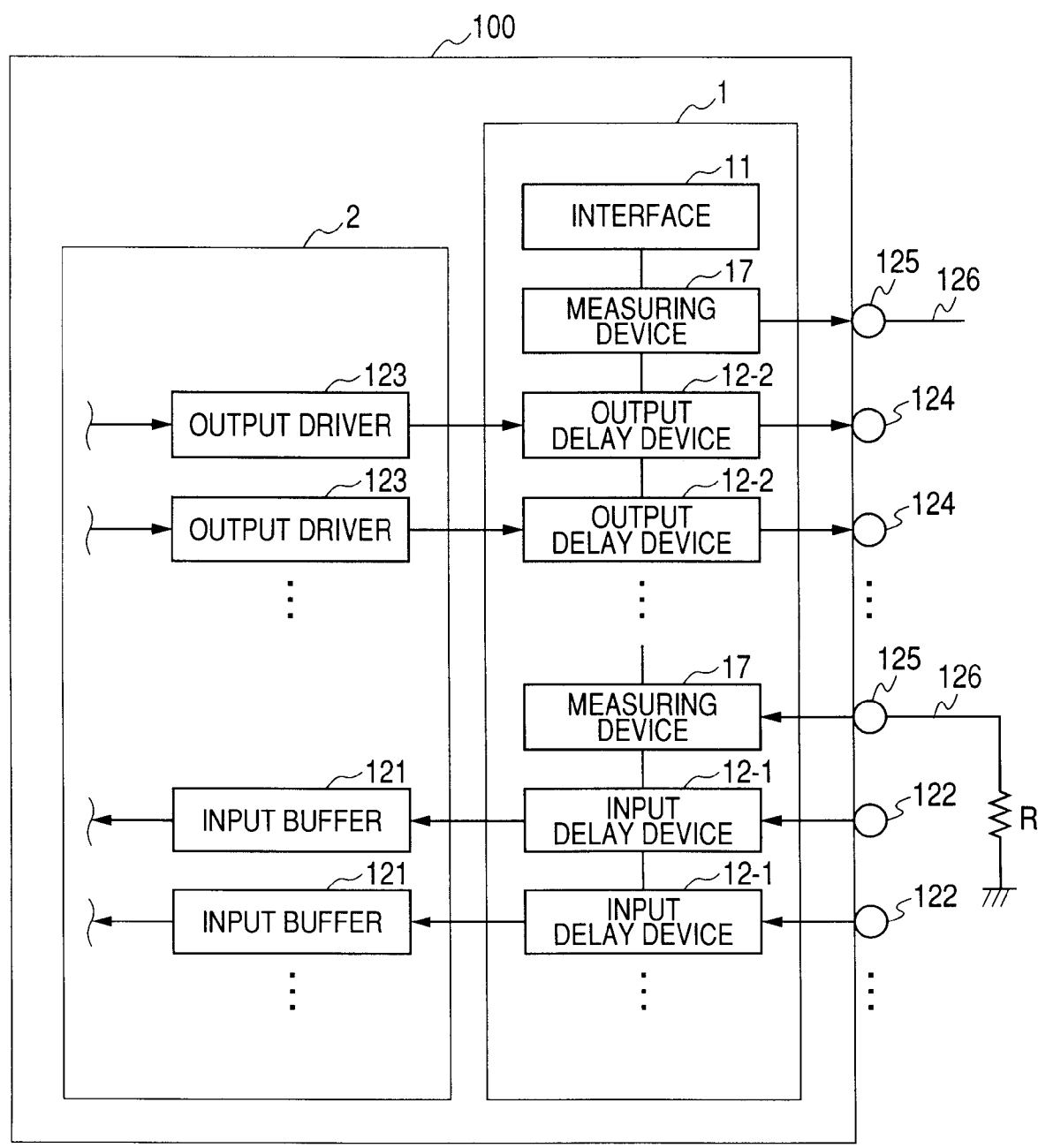
FIG. 12 is a drawing to show a mount example of a delay circuit according to a second embodiment of the invention on a wiring board.
Figure 13:
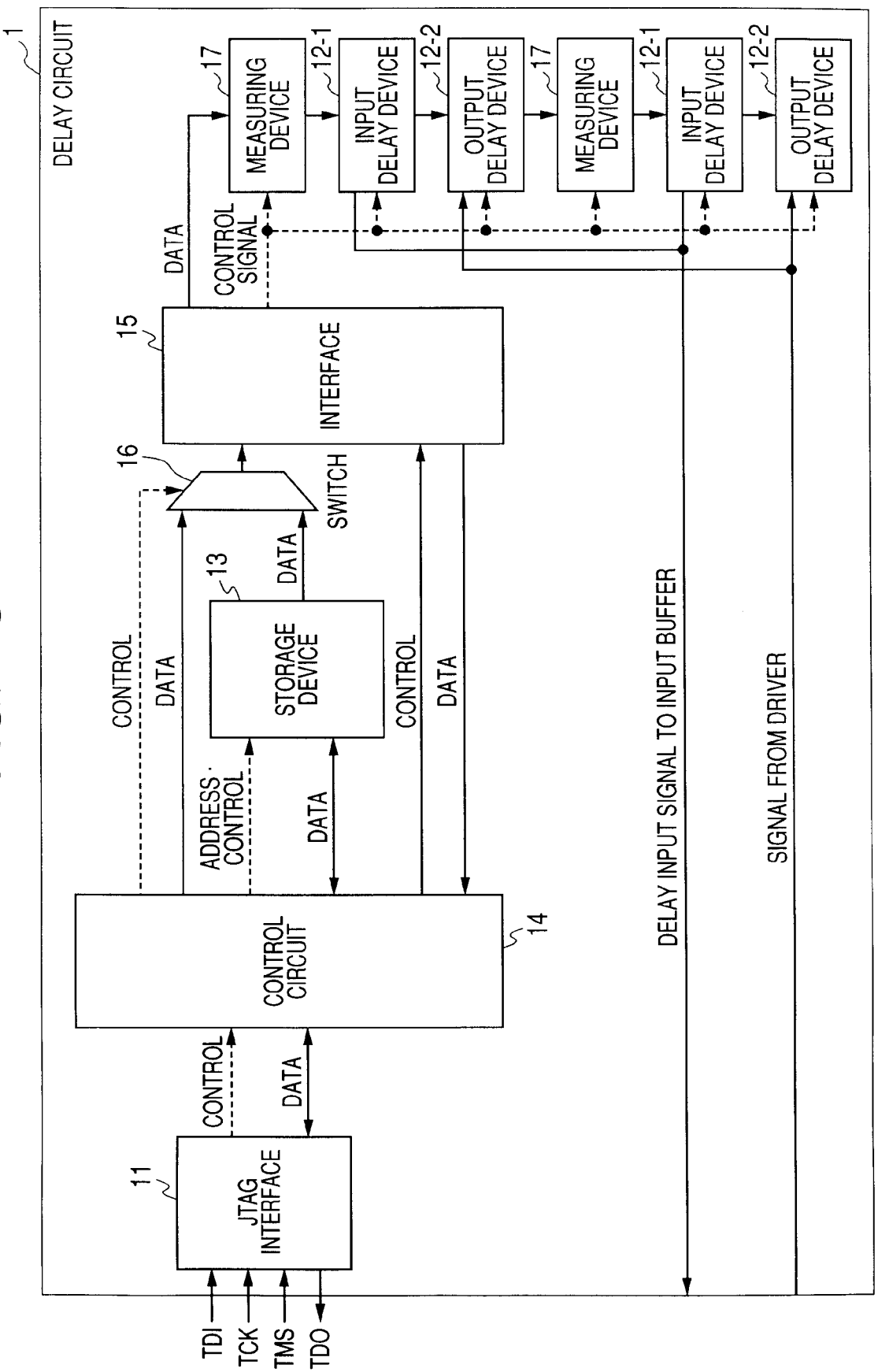
FIG. 13 is a basic block diagram to show the delay circuit according to the second embodiment of the invention.
Figure 14:
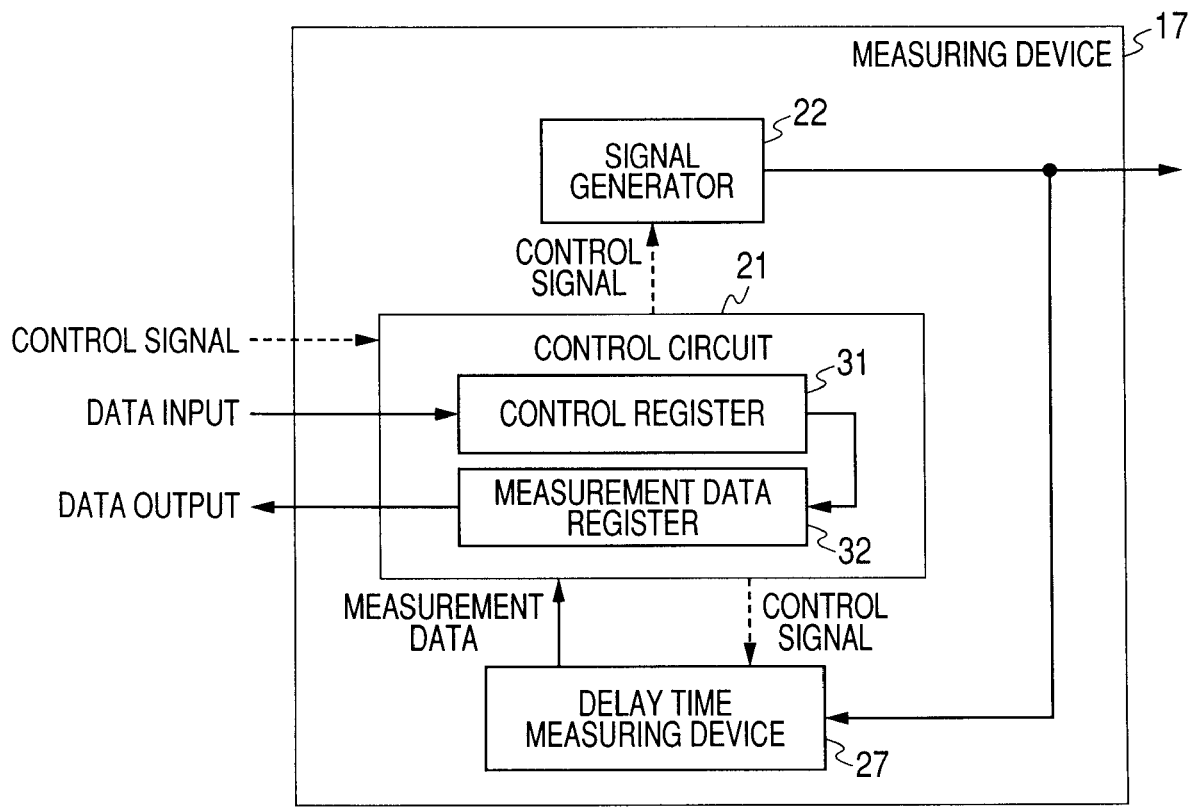
FIG. 14 is a basic block diagram to show a measuring device in the delay circuit according to the second embodiment of the invention shown in FIG. 13.

In a second embodiment of the invention, the signal propagation time of measuring reference wiring provided on a wiring board is actually measured and the delay time is set based on the measurement result. FIG. 12 is a drawing to show a mount example of a delay circuit according to the second embodiment of the invention on a wiring board. In FIGS. 12 to 14, wiring to set a delay time provided on the wiring board will be discussed collectively as wiring for connecting semiconductor chips on the wiring board.

A delay circuit 1 according to the second embodiment of the invention includes an interface 11 for giving a command of setting a delay time, input delay devices 12-1 and output delay devices 12-2 that can be set to any desired delay time, and measuring devices 17 for measuring the signal propagation time of measuring reference wiring provided on a wiring board to set the delay time.

The delay time of each of the input delay devices 12-1 and the output delay devices 12-2 is set according to a command from the interface 11 as in the first embodiment of the invention. The interface 11 is a JTAG (Joint Test Action Group) interface. Measurement data of the measuring device 17 described later in detail (in this case, the signal propagation time of measuring reference wiring) can also be read through the interface 11. The input delay devices 12-1, the output delay devices 12-2, and the measuring devices 17 are connected in series by a JTAG chain.

Each of the input delay devices 12-1 and the output delay devices 12-2 is connected to the input end and the output end of wiring for connecting semiconductor chips 2 on a wiring board 100. In the illustrated example, the semiconductor chip 2 is mounted on the wiring board 100 and the input terminal is denoted by numeral 122 and the output terminal is denoted by numeral 124. Each input delay device 12-1 is provided between an input buffer 121 of the semiconductor chip 2 and the input terminal 122 and each output delay device 12-2 is provided between an output driver 123 of the semiconductor chip 2 and the output terminal 124.

The wiring board for mounting wiring to set the delay time is provided with a microstrip line and a strip line as measuring reference wiring 126. Therefore, the designer, etc., can previously keep track of the length of the measuring reference wiring at the designing time. Likewise, the designer, etc., can also previously keep track of the design length of the wiring of the wiring board to set the delay time because of designing wiring of the wiring board using a CAD system.

The measuring device 17 is connected to the measuring reference wiring 126 through a measuring terminal 125. In the illustrated example, the measuring devices 17 are provided separately each for each of wiring of the input buffers and wiring of the output drivers. At least two measuring devices 17 are provided for the microstrip line and the strip line, but the number of the measuring devices 17 may be increased or decreased as required.

The measuring reference wiring 126 is connected at one end to the measuring terminal 125 and is grounded at an opposite end through a resistor R. The resistance value of the resistor R is set to a sufficiently high value relative to a specific impedance of the wiring pattern on the wiring board. Accordingly, a signal output to the measuring reference wiring 126 through the measuring terminal 125 is reflected and then is returned to the measuring device 17 through the measuring terminal 125. As an alternative example, the measuring reference wiring 126 may be connected at one end to the measuring terminal 125 and may be opened at an opposite end.

FIG. 13 is a basic block diagram to show the delay circuit according to the second embodiment of the invention. As shown in FIG. 13, the delay circuit 1 includes the JTAG interface 11 for giving a command of setting a delay time, the input delay devices 12-1 and the output delay devices 12-2 that can be set to any desired time, a storage device 13 for storing a parameter for defining a delay time, a control circuit 14 for controlling the operation of the delay circuit 1, an interface 15, a switch 16, and the measuring devices 17.

The input delay devices 12-1, the output delay devices 12-2, and the measuring devices 17 are connected in series by a JTAG chain. The input delay devices 12-1 are provided each for each wiring piece to each input buffer of the semiconductor chip and are connected each to each input buffer. The output delay devices 12-2 are provided each for each wiring piece to each output driver of the semiconductor chip and are connected each to each output driver. The number of the delay devices shown in the figure does not limit the invention and may be any other number.

In the second embodiment of the invention, the storage device 13 stores a parameter for defining the delay time for each delay device 12 as in the first embodiment of the invention. When power of the wiring board is turned on, power is also supplied to the delay circuit 1 and the control circuit 14 reads the parameter for defining the delay time for each of the input delay devices 12-1 and the output delay devices 12-2 from the storage device 13 and sets the delay time of each of the input delay devices 12-1 and the output delay devices 12-2.

The acquisition processing of the parameter for defining the delay time in a measurement mode for measuring the signal propagation time of wiring between semiconductor chips in the second embodiment of the invention is as follows:

FIG. 14 is a basic block diagram to show the measuring device in the delay circuit according to the second embodiment of the invention shown in FIG. 13. The connection lines to the semiconductor chip as shown in FIG. 12 are not shown in FIG. 14.

In the measurement mode for measuring the signal propagation time of the wiring of a wiring board, a control circuit 21 in the measuring device 17 provided on the wiring board to set the delay time controls a signal generator 22 so as to generate a propagation time measuring signal. Accordingly, a propagation time measuring signal is transmitted to the measuring reference wiring connected to the measuring terminal of the measuring device 17. The propagation time measuring signal is a pulse signal, for example. At this timing, the control circuit 21 notifies a delay time measuring device 27 that the propagation time measuring signal has been generated. Upon reception of the notification, the delay time measuring device 27 starts counting the time.

Since the measuring reference wiring has the resistor R having a sufficiently high resistance value relative to a specific impedance of the wiring pattern on the wiring board at the opposite end to the end connected to the measuring terminal as described above, the propagation time measuring signal generated by the signal generator 22 propagates on the measuring reference wiring and then is reflected, again propagates on the measuring reference wiring, and passes through the measuring terminal and then arrives at the measuring device 17 connected to the measuring terminal.

The measuring device 17 receives at the delay time measuring device 27 the propagation time measuring signal reflected on the measuring reference wiring and returned. The delay time measuring device 27 stops counting the time at the reception timing. Accordingly, the time difference between the time at which the delay time measuring device 27 receives the propagation time measuring signal and the time at which the signal generator 22 transmits the propagation time measuring signal is measured. This measurement data is sent to the control circuit 21, which then writes the received measurement data into a measurement data register 32.

In the second embodiment of the invention, the measuring devices are provided separately each for the input buffers and the output drivers as described above; the processing described above is executed for the measuring reference wiring provided for the input buffers and the output drivers. The measurement data for each measuring reference wiring piece is acquired by the corresponding measuring device 17 and is written into the measurement data register 32 in the measuring device 17. The measurement data written into the measurement data register 32 in each measuring device 17 is read via a "DATA output" line in FIG. 14 using a control register 31 through the JTAG interface 11 previously described with reference to FIG. 2 or 13.

The read measurement data indicates the time difference between the time at which the delay time measuring device 27 receives the propagation time measuring signal and the time at which the signal generator 22 transmits the propagation time measuring signal as described above. The half time of the time difference is the signal propagation time about the measuring reference wiring.

As described above, the designer, etc., previously forms the measuring reference wiring on the wiring board on which wiring to set the delay time is mounted. Therefore, the designer, etc., can previously keep track of the length of the measuring reference wiring at the designing time. On the other hand, the designer, etc., can also keep track of the design length of the wiring of the wiring board to set the delay time because of designing wiring of the wiring board using a CAD system.

Therefore, the signal propagation time per unit length of the measuring reference wiring can be calculated from the signal propagation time and the length of the measuring reference wiring and thus the delay time of wiring of the wiring board to set the delay time can be estimated by calculation from the signal propagation time per unit length of the measuring reference wiring and the design length of the wiring of the wiring board to set the delay time. In the second embodiment of the invention, the length of the measuring reference wiring and the design length of the wiring of the wiring board to set the delay time are previously input to a computer to which the JTAG interface 11 is connected, and the computer is caused to execute the calculation as described above, whereby the delay time of the wiring of the wiring board to set the delay time is estimated.

Through the interface 15, the control circuit 14 in FIG. 13 keeps track of the maximum one of the signal propagation times about the wiring of the wiring board estimated using the signal propagation time about the measuring reference wiring from the ratio between the design length of the wiring of the wiring board to set the delay time and the length of the measuring reference wiring as described above. The control circuit 14 in FIG. 13 determines that the time difference between the maximum signal propagation time and the signal propagation time estimated about the wiring to set the delay time is the delay time of the wiring to set the delay time.

Each parameter for defining the delay time determined about each wiring piece is stored in the storage device 13 in the delay circuit 1 and the measurement mode is now complete. Also in the second embodiment of the invention, after completion of the measurement mode, the mode is returned to the usual mode as in the first embodiment of the invention.

Figure 15:
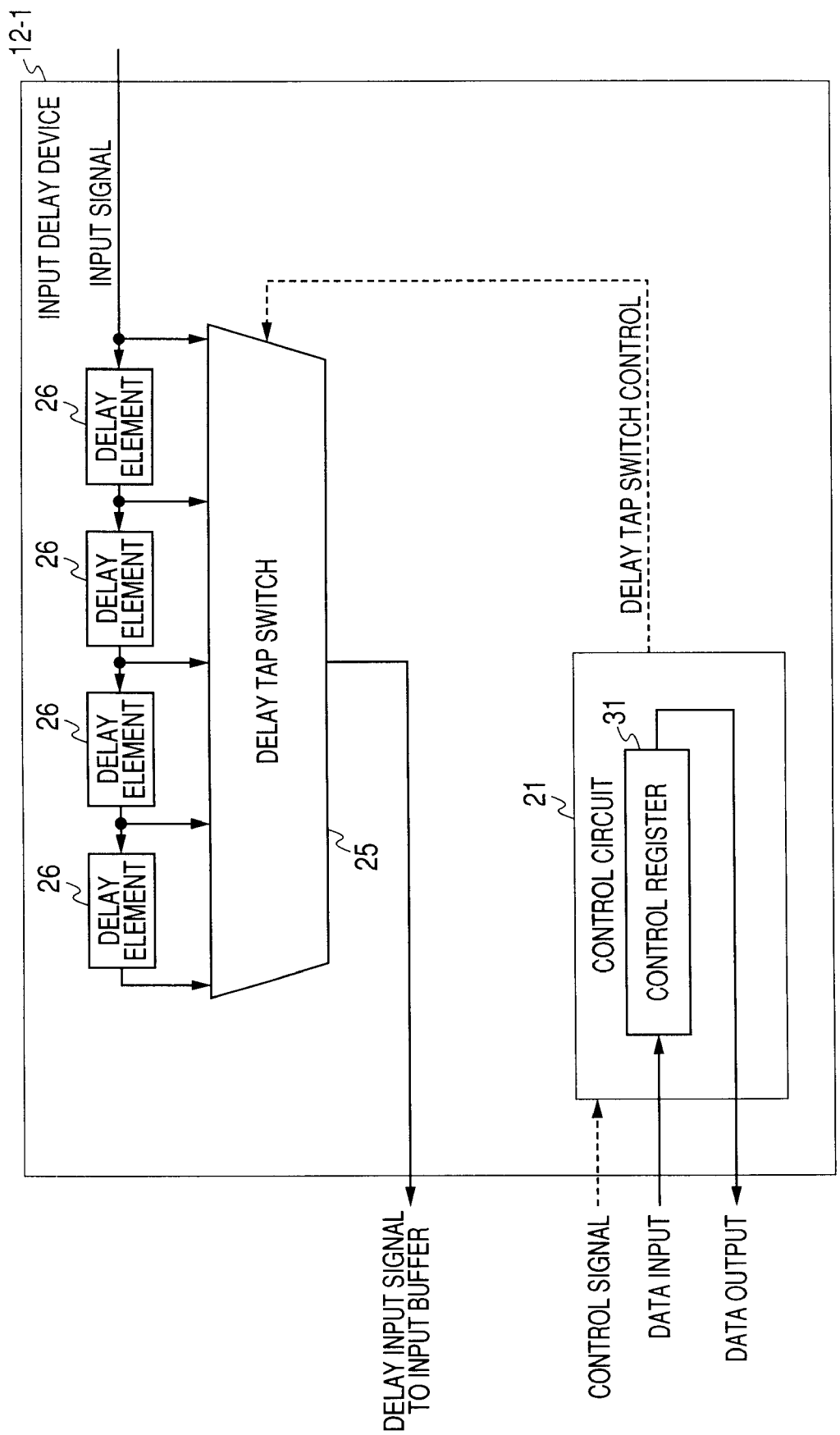
FIG. 15 is a basic block diagram to show an input delay device in the delay circuit according to the second embodiment of the invention shown in FIG. 13.
Figure 16:
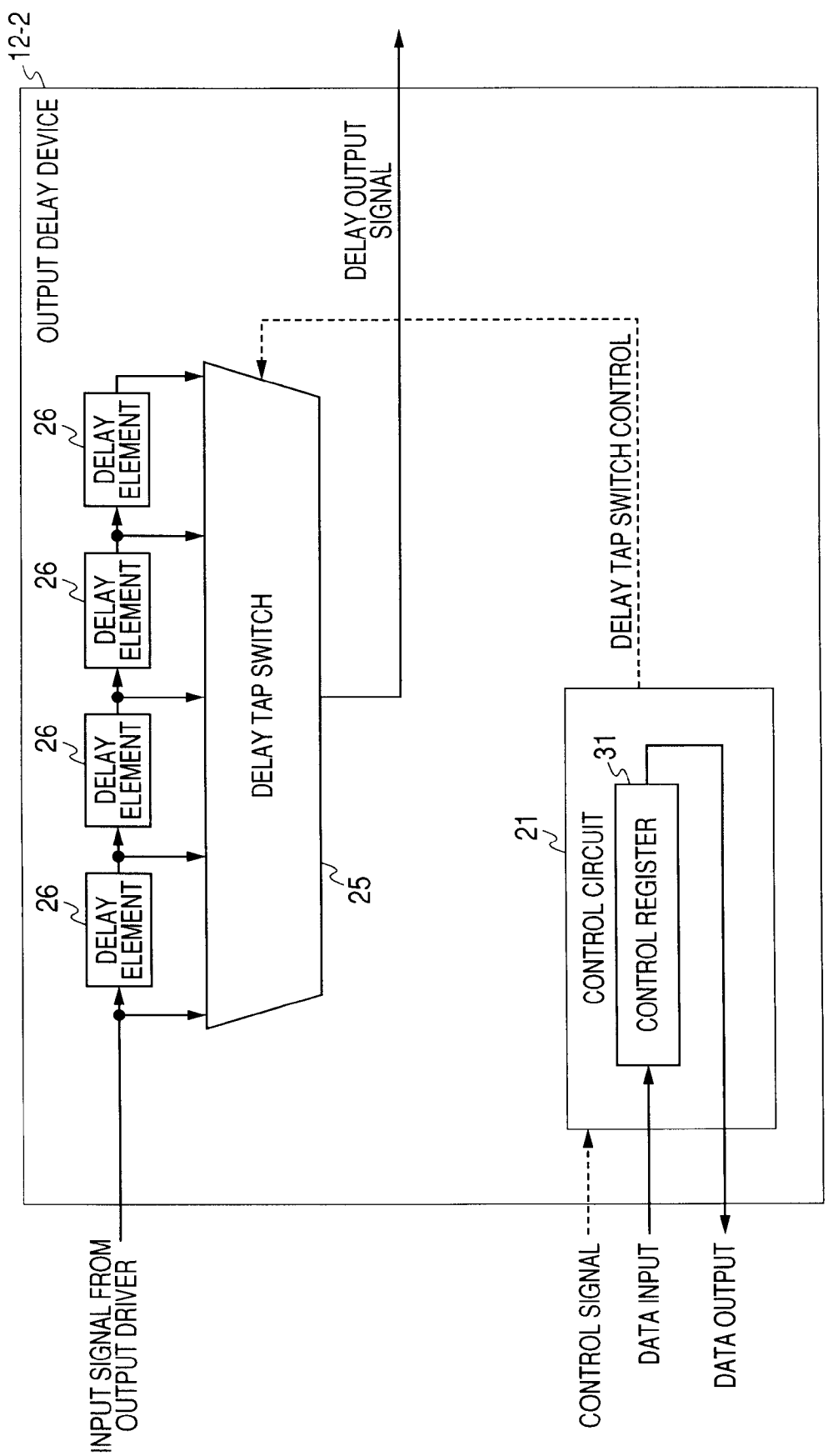
FIG. 16 is a basic block diagram to show an output delay device in the delay circuit according to the second embodiment of the invention shown in FIG. 13.

FIG. 15 is a basic block diagram to show the input delay device in the delay circuit according to the second embodiment of the invention shown in FIG. 13. FIG. 16 is a basic block diagram to show the output delay device in the delay circuit according to the second embodiment of the invention shown in FIG. 13. The connection lines to the semiconductor chip as shown in FIG. 12 are not shown in FIG. 15 or 16.

In the usual mode, when power of the wiring board is turned on, power is also supplied to the delay circuit 1 and the control circuit 14 reads the parameter for defining the delay time for each of the input delay devices 12-1 and the output delay devices 12-2 from the storage device 13 and sets the delay time of each input delay device 12-1 and the delay time of each output delay device 12-2.

The parameter concerning the delay time of the input delay device 12-1 stored in the storage device 13 is read according to a command from the JTAG interface 11 in FIG. 13 and is sent to the input delay device 12-1 via the DATA line through the interface 15.

In the input delay device 12-1 in FIG. 15, the control circuit 21 controls the delay tap switch 25 based on the received parameter concerning the delay time and switches a tap of the delay tap switch 25 so as to select as many delay elements 26 as the number of the delay elements 26 that can provide the necessary delay time.

The parameter concerning the delay time of the output delay device 12-2 stored in the storage device 13 is read according to a command from the JTAG interface 11 in FIG. 13 and is sent to the output delay device 12-2 via the DATA line through the interface 15.

In the output delay device 12-2 in FIG. 16, the control circuit 21 controls the delay tap switch 25 based on the received parameter concerning the delay time and switches a tap of the delay tap switch 25 so as to select as many delay elements 26 as the number of the delay elements 26 that can provide the necessary delay time.

Each of the delay elements 26 generates a predetermined delay amount electrically; it is an LC passive element by way of example, as with the first embodiment of the invention. The number of the delay elements shown in the figure does not limit the invention and may be any other number. If the value of the delay amount generated by each delay element 26 is lessened and then the number of the delay elements 26 is increased, the delay time can be set with higher accuracy.

As the processing sequence described above is performed, in the second embodiment of the invention, the optimum delay time is set (programmed) for each of the input delay devices and the output delay devices provided as the delay circuit at the input end and the output end of each wiring piece between the semiconductor chips based on the signal propagation time measured about the measuring reference wiring provided on the wiring board.

The input pin of the JTAG interface 11 can also be used appropriately to read the signal propagation time about the measuring reference wiring and the setup delay time about each wiring piece between the semiconductor chips to the outside through the JTAG interface 11.

Next, mounting the delay circuit according to the second embodiment of the invention on a wiring board will be discussed. Here, the case where the wiring board is a mount board on which a plurality of semiconductor packages are installed will be discussed with reference to FIGS. 17 and 18. The delay circuit according to the second embodiment of the invention is a delay circuit chip by way of example.

Figure 17:
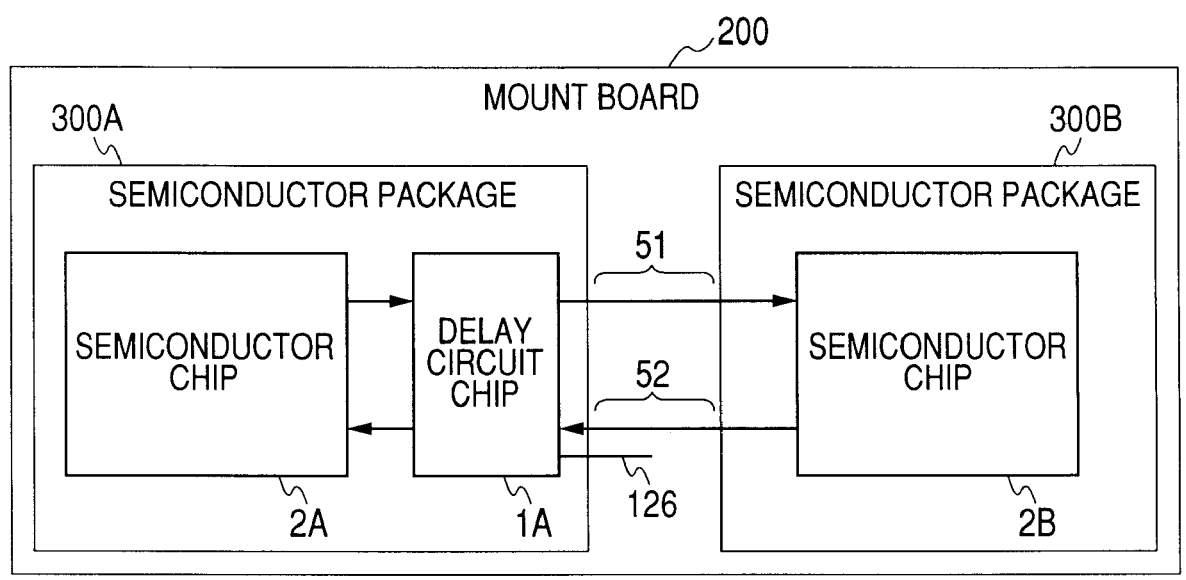
FIG. 17 is a schematic drawing to illustrate the case where the delay circuit according to the second embodiment of the invention is mounted on a mount board on which a plurality of semiconductor packages are installed for adjusting the delay time of wiring for connecting the semiconductor packages.

FIG. 17 is a schematic drawing to illustrate the case where the delay circuit according to the second embodiment of the invention is mounted on a mount board on which a plurality of semiconductor packages are installed for adjusting the delay time of wiring for connecting the semiconductor packages.

Here, the case where semiconductor packages 300A and 300B are mounted on a mount board 200 and semiconductor chips 2A and 2B are mounted on the semiconductor packages 300A and 300B respectively is considered by way of example. The number of the semiconductor packages and the number of the semiconductor chips mounted on the mount board 200 shown in the figure do not limit the invention and each may be any other number.

The semiconductor chip 2A on the semiconductor package 300A and the semiconductor chip 2B on the semiconductor package 300B are electrically connected by wiring 51 and wiring 52 provided on the mount board 200. Skew occurs due to the wiring length difference between the wiring 51 and the wiring 52. Therefore, to adjust the delay time, the delay circuit chip 1A according to the second embodiment of the invention is provided at the input: end and the output end of the semiconductor chip 2A on the semiconductor package 300A. On the other hand, in the second embodiment of the invention unlike the first embodiment of the invention, a delay circuit chip need not be provided on the semiconductor package 300B.

In the second embodiment of the invention, measuring reference wiring 126 is provided on the mount board 200 and is connected to a measuring terminal (not shown) of the delay circuit chip 1A. In the measurement mode, the signal propagation time of the measuring reference wiring 126 is actually measured in a manner previously described using a measuring device (not shown) in the delay circuit chip 1A, and the delay time is set based on the measurement result.

Specifically, in the example in FIG. 17, a propagation time measuring signal output from the output terminal of the delay circuit chip 1A on the semiconductor package 300A propagates on the measuring reference wiring 126. Then, the propagation time measuring signal is reflected and then arrives at the measuring device (not shown) of the delay circuit chip 1A. The signal propagation times of the wiring 51 and the wiring 52 to set the delay time are estimated. The delay times of the wiring 51 and the wiring 52 of the mount board 200 are set according to a technique as previously described based on the estimated signal propagation times.

Figure 18:
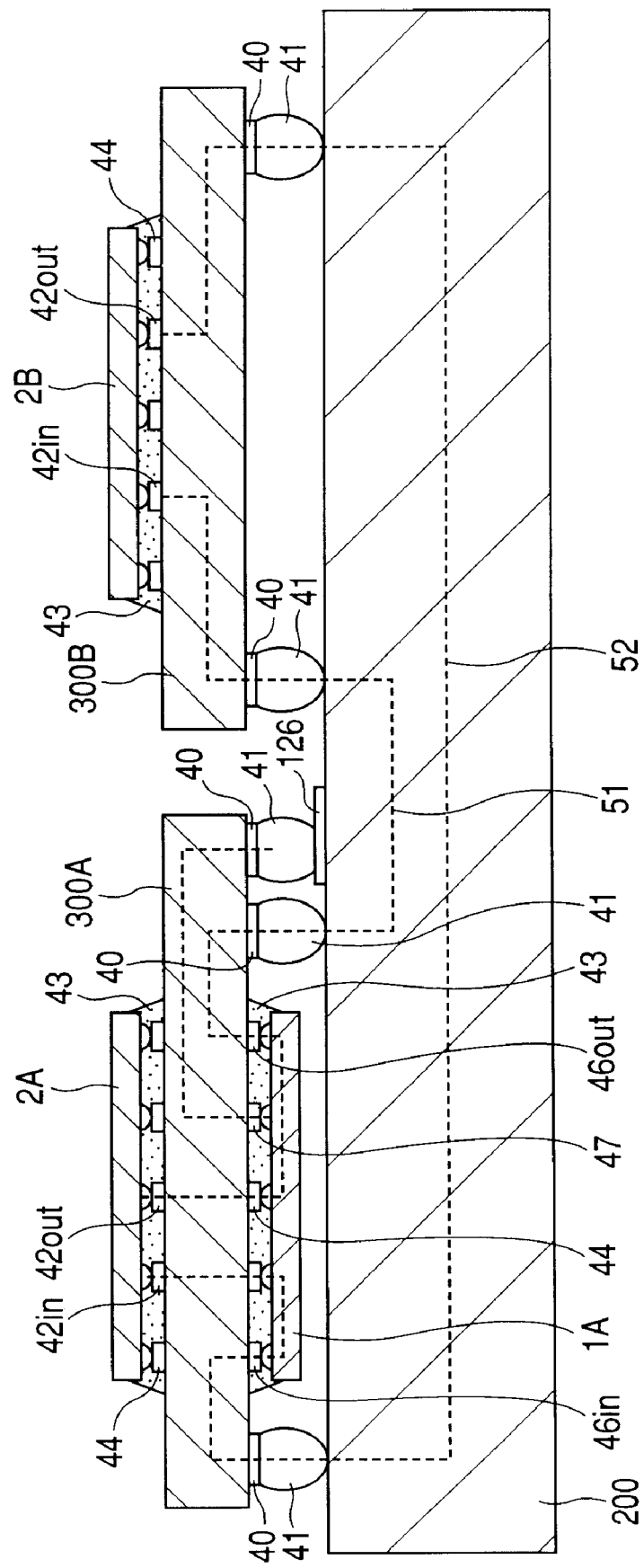
FIG. 18 is a sectional view to illustrate an example of mounting the delay circuits schematically shown in FIG. 17.

FIG. 18 is a sectional view to illustrate an example of mounting the delay circuits schematically shown in FIG. 17. The semiconductor packages 300A and 300B are mounted on the mount board 200. In the illustrated example, the delay circuit chip 1A according to the second embodiment of the invention is mounted on one face of the semiconductor package 300A and the semiconductor chip 2A is mounted on the other face. The semiconductor chip 2B is mounted on one face of the semiconductor package 300B. The measuring reference wiring 126 is provided on the mount board 200. Each measuring terminal connected to the measuring reference wiring 126 and the measuring device (not shown) in the delay circuit chip 1A are implemented as a bump 47. The input terminal of the delay circuit chip 1A is implemented as a bump 46in, and the output terminal of the delay circuit chip 1A is implemented as a bump 46out. The input terminals of the semiconductor chips 2A and 2B are implemented as bumps 42in, and the output terminals of the semiconductor chips 2A and 2B are implemented as bumps 42out. The wiring 51 and the wiring 52 shown in FIG. 17 are indicated by dashed lines in FIG. 18. In this figure, numeral 43 denotes seal resin and numeral 44 denotes a pad.

Figure 19:
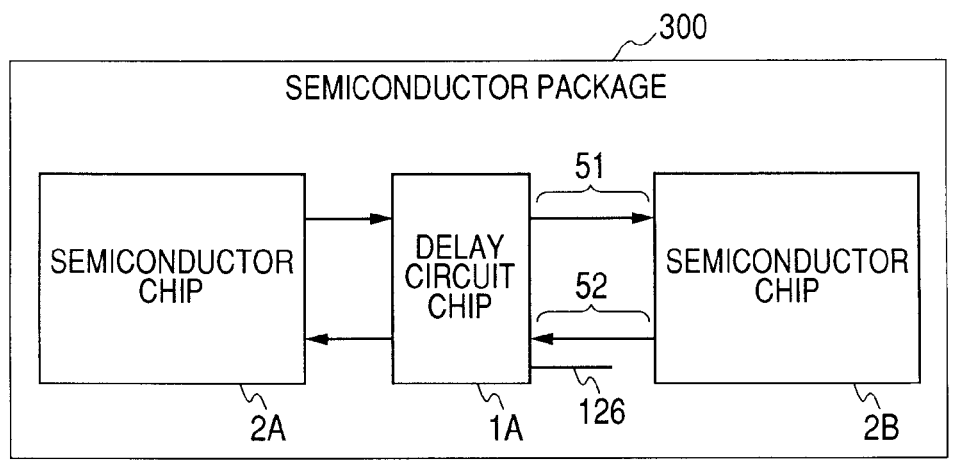
FIG. 19 is a schematic drawing to illustrate the case where the delay circuit according to the second embodiment of the invention is mounted on one of semiconductor packages on which a plurality of semiconductor chips are installed for adjusting the delay time of wiring of the semiconductor package for connecting the semiconductor chips.

Next, the case where a wiring board is a semiconductor package on which a plurality of semiconductor chips are installed will be discussed with reference to FIG. 19. The delay circuit according to the second embodiment of the invention is a delay circuit chip by way of example. FIG. 19 is a schematic drawing to illustrate the case where the delay circuit according to the second embodiment of the invention is mounted on one of semiconductor packages on which a plurality of semiconductor chips are installed for adjusting the delay time of wiring of the semiconductor package for connecting the semiconductor chips.

Here, the case where semiconductor chips 2A and 2B are mounted on a semiconductor package 300 is considered by way of example. The number of the semiconductor chips mounted on the semiconductor package 300 shown in the figure does not limit the invention and each may be any other number.

The semiconductor chips 2A and 2B are electrically connected by wiring 51 and wiring 52 provided on the semiconductor package 300. Skew occurs due to the wiring length difference between the wiring 51 and the wiring 52. Therefore, to adjust the delay time, the delay circuit chip 1A according to the second embodiment of the invention is provided at the input end and the output end of the semiconductor chip 2A on the semiconductor package 300. The measuring reference wiring 126 is provided on the semiconductor package 300 and is connected to the measuring device (not shown) of the delay circuit chip 1A. In the measurement mode, the signal propagation time of the measuring reference wiring 126 is actually measured in a manner previously described using the measuring device (not shown) in the delay circuit chip 1A, and the delay time is set based on the measurement result.

In the example in FIG. 19, a propagation time measuring signal output from the output terminal of the delay circuit chip 1A on the semiconductor package 300 propagates on the measuring reference wiring 126. Then, the propagation time measuring signal is reflected and then arrives at the measuring device (not shown) of the delay circuit chip 1A. The signal propagation times of the wiring 51 and the wiring 52 to set the delay time are estimated. The delay times of the wiring 51 and the wiring 52 of the semiconductor package 300 are set according to a technique as previously described based on the estimated signal propagation times.

Figure 20:
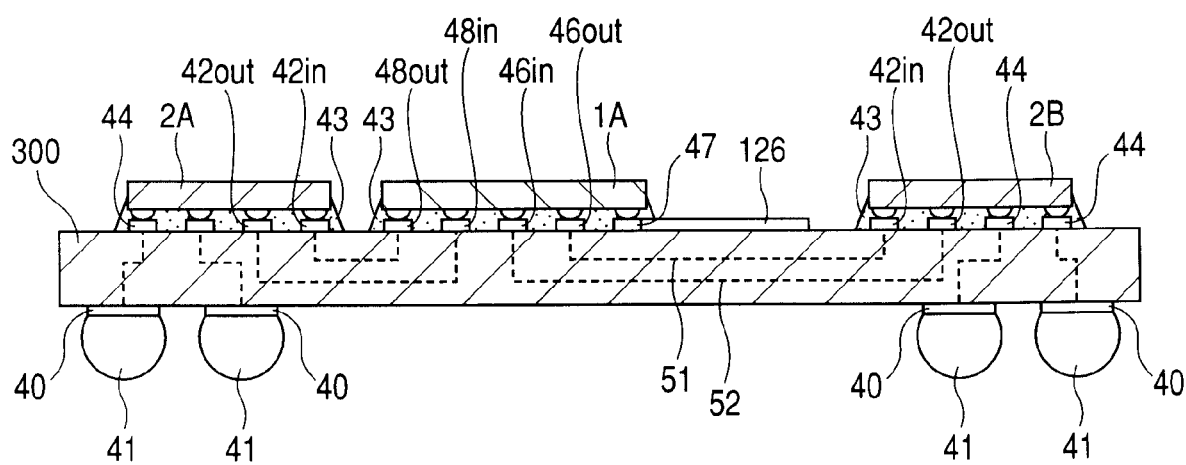
FIG. 20 is a sectional view to illustrate an example of mounting the delay circuit schematically shown in FIG. 19.

FIG. 20 is a sectional view to illustrate an example of mounting the delay circuit schematically shown in FIG. 19. In the illustrated example, the semiconductor chip 2A, the delay circuit chip 1A according to the second embodiment of the invention, and the semiconductor chip 2B are mounted on one face of the semiconductor package 300. The measuring reference wiring 126 is provided on the semiconductor package 300. Each measuring terminal connected to the measuring reference wiring 126 and the measuring device (not shown) in the delay circuit chip 1A are implemented as a bump 47. The input terminal of the delay circuit chip 1A is implemented as a bump 46in, and the output terminal of the delay circuit chip 1A is implemented as a bump 46out. The input terminals of the semiconductor chips 2A and 2B are implemented as bumps 42in, and the output terminals of the semiconductor chips 2A and 2B are implemented as bumps 42out. The wiring 51 and the wiring 52 shown in FIG. 19 are indicated by dashed lines in FIG. 20. In this figure, numeral 43 denotes seal resin and numeral 44 denotes a pad.

Figure 21:
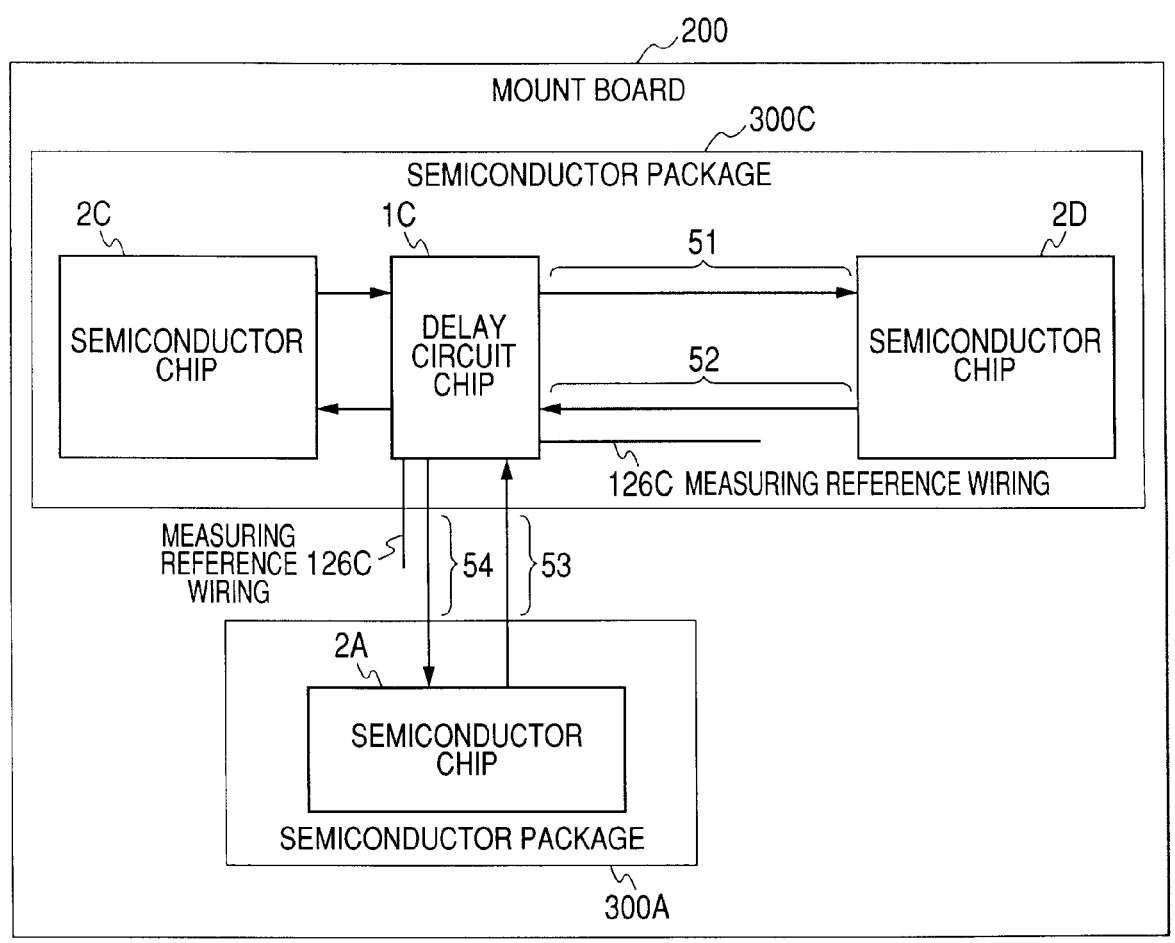
FIG. 21 is a schematic drawing to illustrate the case where a plurality of semiconductor packages are mounted on a mount board and the delay circuit according to the second embodiment of the invention is mounted on one of the semiconductor packages where a plurality of semiconductor chips are mounted for adjusting the delay time of wiring for connecting the semiconductor chips.

Next, the case where a wiring board is a mount board on which a plurality of semiconductor packages are mounted and a plurality of semiconductor chips are mounted on one of the semiconductor packages will be discussed with reference to FIG. 21. The delay circuit according to the second embodiment of the invention is a delay circuit chip byway of example. FIG. 21 is a schematic drawing to illustrate the case where a plurality of semiconductor packages are mounted on a mount board and the delay circuit according to the second embodiment of the invention is mounted on one of the semiconductor packages where a plurality of semiconductor chips are mounted for adjusting the delay time of wiring for connecting the semiconductor chips.

Here, the case where a semiconductor package 300A on which a semiconductor chip 2A is mounted and a semiconductor package 300C on which semiconductor chips 2C and 2D are mounted are mounted on a mount board 200 is considered by way of example. The number of the semiconductor packages and the number of the semiconductor chips mounted on the mount board 200 shown in the figure do not limit the invention and each may be any other number.

The semiconductor chips 2C and 2D on the semiconductor package 300C are electrically connected by wiring 51 and wiring 52 provided on the semiconductor package 300C. The semiconductor chip 2A on the semiconductor package 300A is electrically connected to the semiconductor chip 2C on the semiconductor package 300C by wiring 53 and wiring 54 provided on the mount board 200.

Skew occurs due to the wiring length difference between the wiring 51 and the wiring 52 and between the wiring 53 and the wiring 54. Therefore, to adjust the delay time, the delay circuit chip 1C according to the second embodiment of the invention is provided at the input end and the output end of the semiconductor chip 2C, as shown in the figure. Further, on the semiconductor package 300C, measuring reference wiring 126C to set the delay times of the wiring 51 and the wiring 52 is provided adjacent to the wiring 51 and the wiring 52 and is connected to a measuring terminal (not shown) in the delay circuit chip 1C. Likewise, on a part of the semiconductor package 300C and the mount board 200, measuring reference wiring 126C to set the delay times of the wiring 53 and the wiring 54 is provided adjacent to the wiring 53 and the wiring 54 and is connected to a measuring terminal (not shown) in the delay circuit chip 1C. In the measurement mode, the signal propagation time of the measuring reference wiring 126C is actually measured in a manner previously described using the measuring device (not shown) in the delay circuit chip 1C, and the delay times of the wiring 51, the wiring 52, the wiring 53, and the wiring 54 are set based on the measurement result.

Figure 22:
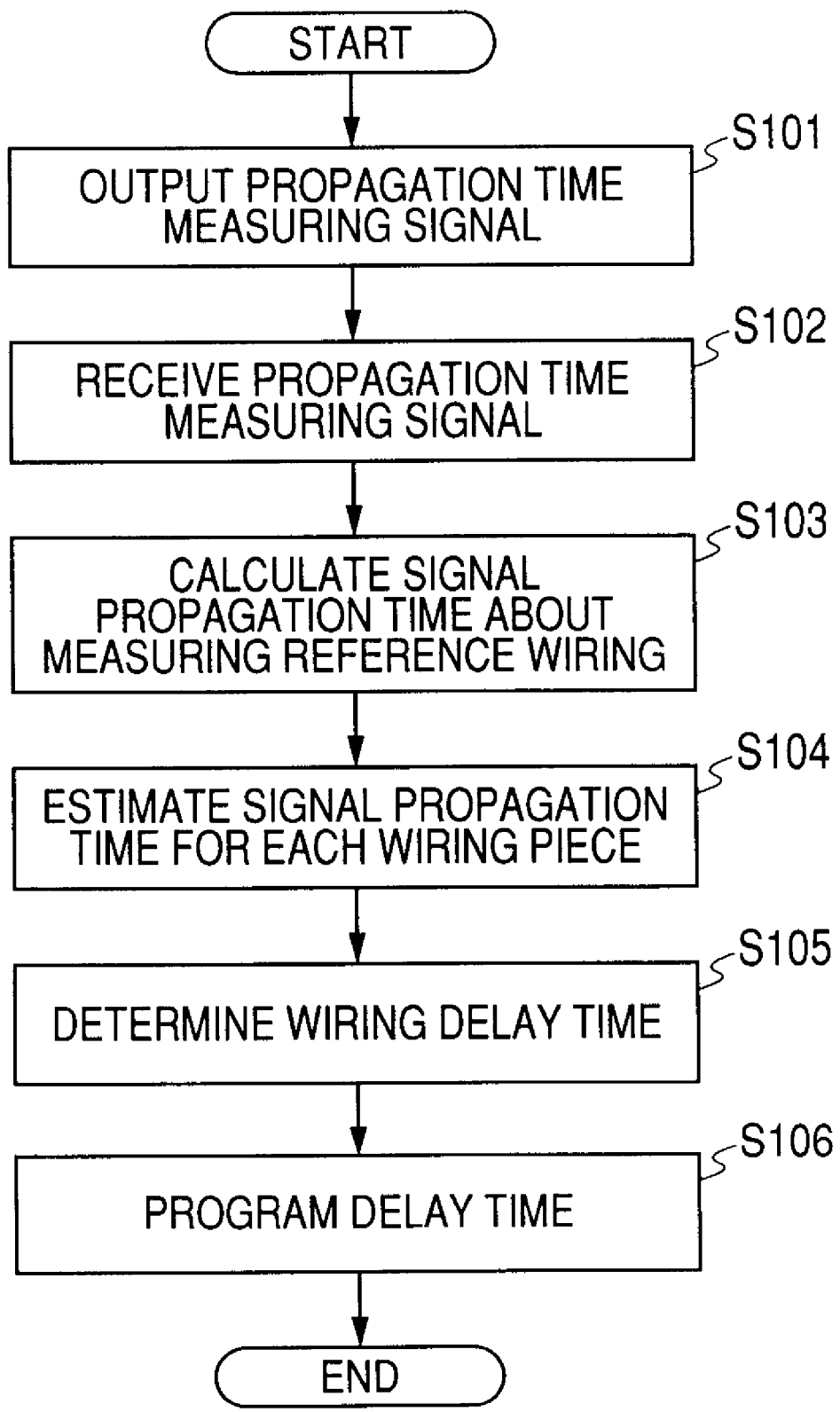
FIG. 22 is a flowchart to show an operation flow about adjustment of the delay time in the delay circuit according to the second embodiment of the invention.

FIG. 22 is a flowchart to show an operation flow about adjustment of the delay time in the delay circuit according to the second embodiment of the invention.

At step S101, in the measurement mode, the control circuit 21 in the measuring device 17 provided on the wiring board to set the delay time controls the signal generator 22 so as to generate a propagation time measuring signal. Accordingly, a propagation time measuring signal is transmitted from the signal generator 22 to the measuring reference wiring 126 connected to the measuring terminal 125 of the measuring device 17. At this timing, the control circuit 21 notifies the delay time measuring device 27 that the propagation time measuring signal has been generated. Upon reception of the notification, the delay time measuring device 27 starts counting the time.

The propagation time measuring signal generated by the signal generator 22 propagates on the measuring reference wiring 126 and then is reflected, again propagates on the measuring reference wiring 126, and passes through the measuring terminal 125 and then arrives at the measuring device 17.

Next, at step S102, the measuring device 17 receives at the delay time measuring device 27 the propagation time measuring signal reflected on the measuring reference wiring 126 and returned. The delay time measuring device 27 stops counting the time at the reception timing. Accordingly, the time difference between the time at which the delay time measuring device 27 receives the propagation time measuring signal and the time at which the signal generator 22 transmits the propagation time measuring signal is measured. This measurement data is sent to the control circuit 21, which then writes the received measurement data into the measurement data register 32. The measurement data for each measuring reference wiring piece is acquired by the corresponding measuring device 17 and is written into the measurement data register 32 in the measuring device 17. The measurement data written into the measurement data register 32 in each measuring device 17 is read via the DATA output line using the control register 31 through the JTAG interface 11.

Next, at step S103, the computer calculates the half time of the time difference between the time at which the delay time measuring device 27 receives the propagation time measuring signal and the time at which the signal generator 22 transmits the propagation time measuring signal as the signal propagation time about the measuring reference wiring 126.

Next, at step S104, the computer can calculate the signal propagation time per unit length of the measuring reference wiring 126 from the signal propagation time and the length of the measuring reference wiring 126 and thus estimates the delay time of wiring of the wiring board to set the delay time by calculation from the signal propagation time per unit length of the measuring reference wiring 126 and the design length of the wiring of the wiring board to set the delay time.

The computer finds the maximum signal propagation time from among the signal propagation times about the wiring of the wiring board estimated as described above. The control circuit 14 in FIG. 13 keeps track of the maximum signal propagation time through the interface 15. At step S105, the control circuit 14 in FIG. 13 determines that the time difference between the maximum signal propagation time and the signal propagation time estimated about the wiring to set the delay time is the delay time of the wiring to set the delay time.

At step S106, in the usual mode, the optimum delay time is set (programmed) for each of the input delay devices and the output delay devices.

The invention can be applied to a circuit for adjusting the delay time of signal propagation of wiring of a wiring board. According to the first and second embodiments of the invention, the delay time of the signal propagation of the wiring of a wiring board can be set according to an electronic technique, so that the delay time can be easily adjusted and can be changed repeatedly. According to the first and second embodiments of the invention, skew of the wiring board can be easily measured and the delay time is set based on the measurement result, so that the delay circuit is highly accurate as compared with setting of the delay time based on calculation at the design work time in related arts. Further, a delay circuit also capable of covering miniaturization and high density mounting of a wiring board can be implemented. According to the first embodiment of the invention, an external special jig or measuring apparatus for adjusting or changing the delay time is not required. According to the second embodiment of the invention, it is possible to set the delay time hard to receive the effect of ambient heat change.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A delay circuit for adjusting a delay time of signal propagation of wiring of a wiring board, said delay circuit comprising:
    an interface for giving a command of setting a delay time;
    a delay device that can be set to any desired delay time; and
    a storage device for storing a parameter for defining a delay time,
    wherein said delay device is adapted to have a delay time set based on the parameter according to the command from said interface and said delay device is adapted to be provided at both an input end and an output end of the wiring of the wiring board, and
    wherein said delay device has:
        a signal generator for transmitting a propagation time measuring signal to the wiring of the wiring board to set the delay time in a measurement mode;
        a reception section for receiving the propagation time measuring signal reflected on the wiring of the wiring board to set the delay time in the measurement mode;
        a measurement section for measuring the time difference between the time at which the reception section receives the propagation time measuring signal and the time at which the signal generator transmits the propagation time measuring signal and setting the half time of the time difference as a signal propagation time about the wiring of the wiring board to set the delay time in the measurement mode; and
        a determination section for determining that the time difference between the maximum one of the signal propagation times measured about the wiring of the wiring board and the signal propagation time measured about the wiring of the wiring board to set the delay time is the delay time of the wiring of the wiring board to set the delay time.

2. The delay circuit as claimed in claim 1 wherein said delay device has a signal reflection section for reflecting the propagation time measuring signal, and
    wherein in the measurement mode, the propagation time measuring signal transmitted from the signal generator in said delay device connected to one terminal of the wiring of the wiring board to set the delay time is reflected by the signal reflection section in said delay device connected to another terminal of the wiring of the wiring board to set the delay time.

3. The delay circuit as claimed in claim 1 wherein the parameter for defining the delay time determined by the determination section is stored in the storage device.

4. The delay circuit as claimed in claim 1 wherein the signal propagation time about the wiring of the wiring board measured by the measurement section can be read to the outside through said interface.

5. A delay circuit for adjusting a delay time of signal propagation of wiring of a wiring board, said delay circuit comprising:
    an interface for giving a command of setting a delay time;
    a delay device that can be set to any desired delay time;
    a storage device for storing a parameter for defining a delay time; and
    a measuring device for measuring a signal propagation time of the wiring of the wiring board to set the delay time,
    wherein said delay device is adapted to have a delay time set based on the parameter according to the command from said interface and said delay device is adapted to be provided at both an input end and an output end of the wiring of the wiring board, and
    wherein the measuring device has:
        a signal generator for transmitting a propagation time measuring signal to measuring reference wiring connected to the measuring device in a measurement mode;
        a reception section for receiving the propagation time measuring signal reflected on the measuring reference wiring in the measurement mode; and
        a measurement section for measuring the time difference between the time at which the reception section receives the propagation time measuring signal and the time at which the signal generator transmits the propagation time measuring signal and setting the half time of the time difference as a signal propagation time about the measuring reference wiring.

6. The delay circuit as claimed in claim 5 further comprising:
    a determination section for determining that the time difference between the maximum one of the signal propagation times about the wiring of the wiring board estimated using the signal propagation time about the measuring reference wiring from the ratio between the design length of the wiring of the wiring board to set the delay time and the length of the measuring reference wiring and the signal propagation time estimated about the wiring of the wiring board to set the delay time is the delay time of the wiring of the wiring board to set the delay time.

7. The delay circuit as claimed in claim 5 wherein the signal propagation time about the measuring reference wiring measured by the measurement section can be read to the outside through said interface.

8. The delay circuit as claimed in claim 6 wherein the parameter for defining the delay time determined by the determination section is stored in the storage device.

9. A delay circuit for adjusting a delay time of signal propagation of wiring of a wiring board, said delay circuit comprising:
   a JTAG interface for giving a command of setting a delay time; and
   a delay device that can be set to any desired delay time,
   wherein the delay time of said delay device is set according to the command from said interface.

10. A delay circuit for adjusting a delay time of signal propagation of wiring of a wiring board, said delay circuit comprising:
    a delay device that is connected to an input end and an output end of the wiring of the wiring board and can be set to any desired delay time, wherein
    said delay device has:
       a signal generator for transmitting a propagation time measuring signal to the wiring of the wiring board to set the delay time in a measurement mode;
       a reception section for receiving the propagation time measuring signal reflected on the wiring of the wiring board to set the delay time in the measurement mode;
       a measurement section for measuring the time difference between the time at which the reception section receives the propagation time measuring signal and the time at which the signal generator transmits the propagation time measuring signal and setting the half time of the time difference as the signal propagation time about the wiring of the wiring board to set the delay time in the measurement mode; and
       a calculation section for determining that the time difference between the maximum one of the signal propagation times measured about the wiring of the wiring board and the signal propagation time measured about the wiring of the wiring board to set the delay time is the delay time of the wiring of the wiring board to set the delay time.

11. The delay circuit as claimed in claim 10 wherein the wiring board is a mount board on which a plurality of semiconductor packages are installed, and
    wherein the wiring of the wiring board is wiring of the mount board for connecting the semiconductor packages.

12. The delay circuit as claimed in claim 10 wherein the wiring board is a semiconductor package on which a plurality of semiconductor chips are installed, and
    wherein the wiring of the wiring board is wiring of the semiconductor package for connecting the semiconductor chips.

13. A delay circuit for adjusting a delay time of signal propagation of wiring of a wiring board, said delay circuit comprising:
    a delay device that is connected to an input end and an output end of the wiring of the wiring board and can be set to any desired delay time; and
    a measuring device for measuring the signal propagation time of measuring reference wiring provided on the wiring board to set the delay time,
    wherein said measuring device has:
       a signal generator for transmitting a propagation time measuring signal to the measuring reference wiring connected to said measuring device in a measurement mode;
       a reception section for receiving the propagation time measuring signal reflected on the measuring reference wiring in the measurement mode;
       a measurement section for measuring the time difference between the time at which the reception section receives the propagation time measuring signal and the time at which the signal generator transmits the propagation time measuring signal and setting the half time of the time difference as the signal propagation time about the measuring reference wiring in the measurement mode; and
       a calculation section for determining that the time difference between the maximum one of the signal propagation times about the wiring of the wiring board estimated using the signal propagation time about the measuring reference wiring from the ratio between the design length of the wiring of the wiring board to set the delay time and the length of the measuring reference wiring and the signal propagation time estimated about the wiring of the wiring board to set the delay time is the delay time of the wiring of the wiring board to set the delay time.

14. The delay circuit as claimed in claim 13 wherein the wiring board is a mount board on which a plurality of semiconductor packages are installed, and
    wherein the wiring of the wiring board is wiring of the mount board for connecting the semiconductor packages.

15. The delay circuit as claimed in claim 13 wherein the wiring board is a semiconductor package on which a plurality of semiconductor chips are installed, and
    wherein the wiring of the wiring board is wiring of the semiconductor package for connecting the semiconductor chips.

16. A delay time adjustment method for adjusting a delay time of signal propagation of wiring of a wiring board, said method comprising:
    a transmitting step of transmitting a propagation time measuring signal from a terminal to which a delay circuit is to be connected, of the wiring of the wiring board to set the delay time to the wiring of the wiring board to set the delay time in a measurement mode;
    a receiving step of receiving the propagation time measuring signal reflected on the wiring of the wiring board to set the delay time in the measurement mode;
    a measuring step of calculating the time difference between the time at which the propagation time measuring signal is received in said receiving step and the time at which the propagation time measuring signal is transmitted in said transmitting step and measuring the half time of the time difference as the signal propagation time about the wiring of the wiring board to set the delay time in the measurement mode;
    a calculating step of determining that the time difference between the maximum one of the signal propagation times measured about the wiring of the wiring board and the signal propagation time measured about the wiring of the wiring board to set the delay time is the delay time of the wiring of the wiring board to set the delay time; and a setting step of setting the delay time for a delay device that is provided as the delay circuit connected to the wiring of the wiring board and can be set to any desired delay time.

17. A delay time adjustment method for adjusting a delay time of signal propagation of wiring of a wiring board, said method comprising:

a transmitting step of transmitting a propagation time measuring signal from a measuring terminal provided on the wiring board to set the delay time to measuring reference wiring connected to the measuring terminal in a measurement mode;

a receiving step of receiving the propagation time measuring signal reflected on the measuring reference wiring in the measurement mode;

a measuring step of calculating the time difference between the time at which the propagation time measuring signal is received in said receiving step and the time at which the propagation time measuring signal is transmitted in said transmitting step and measuring the half time of the time difference as the signal propagation time about the measuring reference wiring in the measurement mode;

a calculating step of determining that the time difference between the maximum one of the signal propagation times about the wiring of the wiring board estimated using the signal propagation time about the measuring reference wiring from the ratio between the design length of the wiring of the wiring board to set the delay time and the length of the measuring reference wiring and the signal propagation time estimated about the wiring of the wiring board to set the delay time is the delay time of the wiring of the wiring board to set the delay time; and a setting step of setting the delay time for a delay device that is provided as a delay circuit connected to the wiring of the wiring board and can be set to any desired delay time.

* * * * *